US012082384B2

(12) United States Patent
Fuchigami

(10) Patent No.: US 12,082,384 B2
(45) Date of Patent: Sep. 3, 2024

(54) WIRE HARNESS

(71) Applicant: SUMITOMO WIRING SYSTEMS, LTD., Yokkaichi (JP)

(72) Inventor: Masahiro Fuchigami, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 17/769,547

(22) PCT Filed: Apr. 13, 2020

(86) PCT No.: PCT/JP2020/016296
§ 371 (c)(1),
(2) Date: Apr. 15, 2022

(87) PCT Pub. No.: WO2021/084780
PCT Pub. Date: May 6, 2021

(65) Prior Publication Data
US 2024/0138130 A1   Apr. 25, 2024
US 2024/0237317 A9   Jul. 11, 2024

(30) Foreign Application Priority Data
Oct. 31, 2019   (JP) .................................. 2019-198927

(51) Int. Cl.
*H05K 9/00* (2006.01)
*B60R 16/02* (2006.01)
*H02G 3/04* (2006.01)
*H01B 7/00* (2006.01)

(52) U.S. Cl.
CPC ....... *H05K 9/0066* (2013.01); *B60R 16/0215* (2013.01); *H02G 3/0406* (2013.01); *H02G 3/0468* (2013.01); *H01B 7/0045* (2013.01)

(58) Field of Classification Search
None
See application file for complete search history.

(56) References Cited

U.S. PATENT DOCUMENTS

| 6,023,023 A | 2/2000 | Takeuchi |
| 11,792,967 B2 * | 10/2023 | Grosse ................ H05K 9/0005 174/350 |
| 2010/0084179 A1 * | 4/2010 | Harris .................. D03D 1/0043 174/126.1 |
| 2012/0298404 A1 | 11/2012 | Tokunaga et al. |

(Continued)

FOREIGN PATENT DOCUMENTS

| JP | H10-215096 A | 8/1998 |
| JP | 2007-28820 A | 2/2007 |

(Continued)

OTHER PUBLICATIONS

Jul. 14, 2020 International Search Report issued in International Patent Application No. PCT/JP2020/016296.

*Primary Examiner* — Krystal Robinson
(74) *Attorney, Agent, or Firm* — Oliff PLC

(57) ABSTRACT

A wire harness including: a wire; an electromagnetic wave absorber provided on an outer circumference of a portion of the wire in a length direction of the wire; a protector that has an accommodation configured to accommodate the wire and accommodate the electromagnetic wave absorber; and a first fixing member configured to fix the electromagnetic wave absorber to the protector.

11 Claims, 8 Drawing Sheets

(56) References Cited

U.S. PATENT DOCUMENTS

| | | | | |
|---|---|---|---|---|
| 2013/0112473 A1* | 5/2013 | Toyama | ............... | B60R 16/0215 |
| | | | | 174/70 R |
| 2014/0182921 A1* | 7/2014 | Imahori | ............... | H05K 9/0066 |
| | | | | 174/350 |
| 2017/0040096 A1 | 2/2017 | Hayase | | |

FOREIGN PATENT DOCUMENTS

| | | |
|---|---|---|
| JP | 2011-259568 A | 12/2011 |
| JP | 2012-152090 A | 8/2012 |
| JP | 2013-254762 A | 12/2013 |
| JP | 2014-130886 A | 7/2014 |
| JP | 2017-037914 A | 2/2017 |

* cited by examiner

WIRE HARNESS

BACKGROUND

This disclosure relates to a wire harness.

Conventionally, wire harnesses, which are provided with wires that electrically connect a plurality of electrical devices and electromagnetic wave absorbing members that absorb electromagnetic waves (electromagnetic noise) emitted from the wires, are known as wire harnesses that are mounted in vehicles such as hybrid vehicles and electric vehicles. As a result of inserting a wire into a through-hole in an electromagnetic wave absorbing member constituted by a ferrite core, the electromagnetic wave absorbing member is provided on an outer circumference of the wire in a wire harness of this type (see JP 2014-130886A, for example).

SUMMARY

Incidentally, with the above-described wire harness, as the electromagnetic waves, which need to be reduced, increase in size, the size of the electromagnetic wave absorbing member increases. When a wire is inserted into such a large electromagnetic wave absorbing member, there is a risk that the electromagnetic wave absorbing member may vibrate due to vibration caused by the traveling of a vehicle, for example, and the wire may be shaken by the vibration of the electromagnetic wave absorbing member, and the wire may be impaired.

An exemplary aspect of the disclosure provides a wire harness capable of suppressing vibration of an electromagnetic wave absorbing member.

A wire harness according to this disclosure includes a wire, an electromagnetic wave absorber provided on an outer circumference of a portion of the wire in a length direction of the wire, a protector that has an accommodation that accommodates the wire and the electromagnetic wave absorber, and a first fixing member that fixes the electromagnetic wave absorber to the protector.

A wire harness according to this disclosure achieves the effect of being able to suppress vibration of an electromagnetic wave absorber.

DETAILED DESCRIPTION OF EMBODIMENTS

Figure 1:
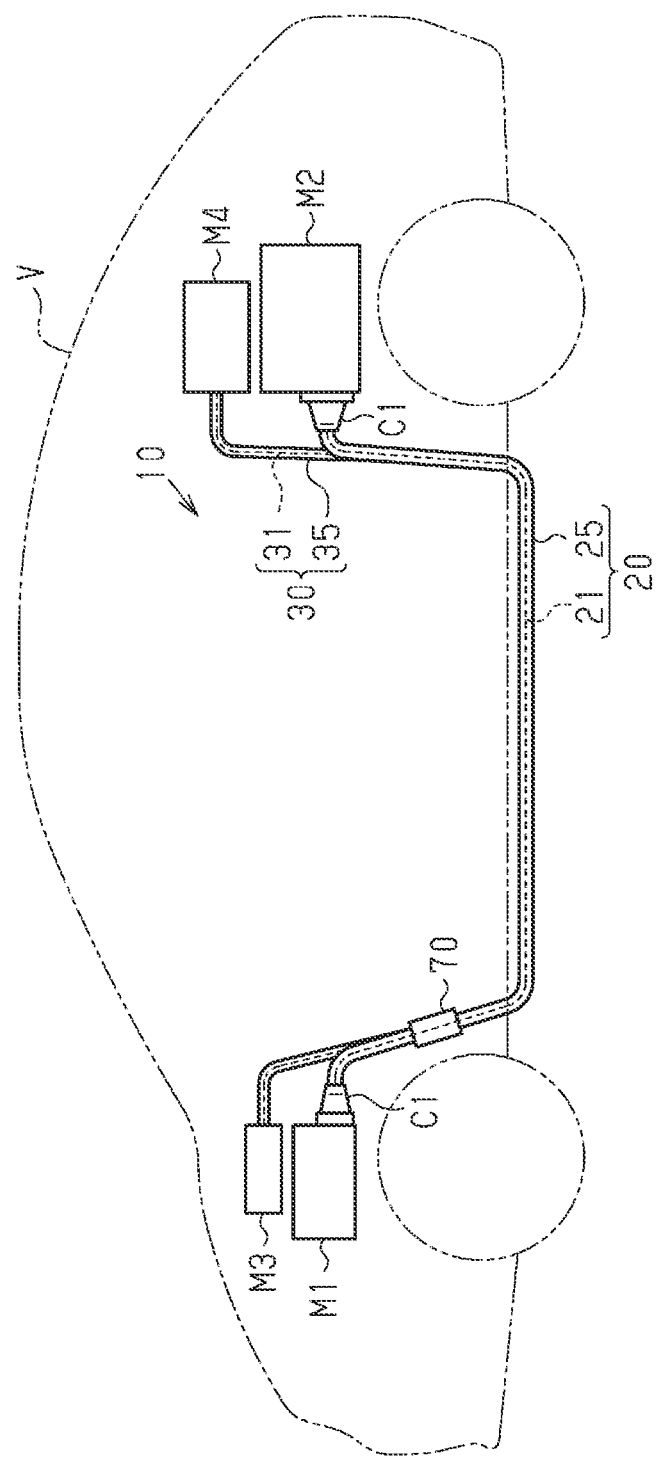
FIG. 1 is a schematic configuration diagram showing a wire harness according to an embodiment.

Description of Embodiments of the Present Disclosure

First, embodiments of this disclosure will be described below.

[1] A wire harness according to this disclosure includes a wire, an electromagnetic wave absorbing member provided on an outer circumference of a portion of the wire in a length direction of the wire, a protector that has an accommodation portion configured to accommodate the wire and accommodate the electromagnetic wave absorbing member, and a first fixing member configured to fix the electromagnetic wave absorbing member to the protector.

According to this configuration, the electromagnetic wave absorbing member is accommodated in the protector, and the electromagnetic wave absorbing member is fixed to the protector by the first fixing member. Thus, it is possible to more stably hold the electromagnetic wave absorbing member with the protector and the first fixing member compared to a case where the electromagnetic wave absorbing member is held by only the wire. Accordingly, it is possible to suppress vibration of the electromagnetic wave absorbing member due to vibration caused by traveling of a vehicle, and to suppress impairment of the wire due to the vibration of the electromagnetic wave absorbing member.

[2] It is preferable that an outer circumferential surface of the protector has a mounting groove for positioning the first fixing member in the length direction of the wire.

According to this configuration, the first fixing member can be positioned by mounting the first fixing member in the mounting groove. Therefore, it is possible to improve workability when mounting the first fixing member on the electromagnetic wave absorbing member and the protector. Also, by mounting the first fixing member in the mounting groove, it is possible to suppress movement of the first fixing member in the length direction of the wire. Accordingly, it is possible to suppress displacement of the first fixing member in the length direction of the wire. Therefore, the electromagnetic wave absorbing member can be stably fixed to the protector by the first fixing member.

[3] It is preferable that the electromagnetic wave absorbing member includes a ring-shaped magnetic core and a ring-shaped case configured to accommodate the magnetic core, and an outer circumferential surface of the case has a pair of protruding portions that are provided at an interval in the length direction of the wire.

According to this configuration, by mounting the first fixing member between the pair of protruding portions, the movement of the first fixing member in the length direction of the wire on the outer circumferential surface of the case can be restricted by the pair of protruding portions. Accordingly, it is possible to suppress displacement of the first fixing member in the length direction of the wire. Therefore, the electromagnetic wave absorbing member can be stably fixed by the first fixing member to the protector.

Here, a "ring" in this specification includes a circular ring whose outer edge has a circular shape, a ring whose outer edge has an elliptical or oval shape, a polygonal ring whose outer edge has a polygonal shape, and a ring whose outer edge has a rounded polygonal shape, and a "ring" refers to any ring whose outer edge has any closed shape connected by straight lines or curved lines. A "ring" includes a ring with a shape having a through-hole in a plan view, and a shape whose outer edge has the same shape as the inner circumferential shape of the through-hole and a shape whose outer edge has a shape that is different from the inner circumferential shape of the through-hole. A "ring" includes a ring with a shape that has a predetermined length extending in a direction in which the through-hole passes therethrough, and the magnitude of the length thereof is not limited. Also, a "ring shape" in this specification need only be regarded as a ring overall, and includes a shape that includes a notch or the like in a portion thereof, such as a C-shape.

[4] It is preferable that a length L1 of the electromagnetic wave absorbing member in the length direction of the wire, a length L2 of the accommodation portion in the length direction of the wire, a groove width W1 of the mounting groove in the length direction of the wire, and the shortest distance D1 between the pair of protruding portions in the length direction of the wire satisfy a relational expression $D1>(L2-L1)+W1$.

According to this configuration, even if the electromagnetic wave absorbing member has moved in the length direction of the wire in the accommodation portion, it is possible to suitably dispose the mounting groove between the pair of protruding portions in the length direction of the wire. Accordingly, the first fixing member can be mounted between the pair of protruding portions by mounting the first fixing member in the mounting groove. As a result, it is possible to suppress displacement of the first fixing member on the outer circumferential surface of the protector and to suppress displacement of the first fixing member on the outer circumferential surface of the electromagnetic wave absorbing member.

[5] Preferably, the wire harness further includes: a covering member covering the outer circumference of a portion of the wire in the length direction; and a second fixing member configured to fix one end portion of the covering member in a length direction of the covering member to the wire, in which the electromagnetic wave absorbing member is provided on an outer circumference of the covering member, the covering member has a first locking portion formed on an outer circumferential surface thereof, and the case has a second locking portion that is locked to the first locking portion in the length direction of the covering member.

According to this configuration, as a result of the first locking portion of the covering member and the second locking portion of the case of the electromagnetic wave absorbing member being locked to each other, it is possible to suppress the movement of the electromagnetic wave absorbing member in the length direction of the covering member. Accordingly, it is possible to suppress displacement of the electromagnetic wave absorbing member in the length direction of the covering member.

Also, because the electromagnetic wave absorbing member is provided on the outer circumference of the covering member that covers the outer circumference of the wire, the covering member is interposed between the wire and the electromagnetic wave absorbing member. Therefore, it is possible to inhibit the electromagnetic wave absorbing member from coming into direct contact with the outer circumferential surface of the wire. Accordingly, it is possible to suppress impairment of the wire due to the contact between the wire and the electromagnetic wave absorbing member.

[6] Preferably, the covering member is a corrugated tube having an accordion structure in which ring-shaped protrusions and ring-shaped recesses are arranged alternatingly in an axial direction in which a central axis of the covering member extends, the case has two side walls that are provided on two ends of the case in an axial direction of the case, and a circumferential wall that is provided between the two side walls and extends in a circumferential direction and the axial direction of the case, the side walls are each provided with a through-hole through which the covering member passes, the second locking portion is formed so as to protrude inward from an inner circumferential surface of the through-hole in a radial direction of the case, and the second locking portion fits in a ring-shaped recess among the ring-shaped recesses.

According to this configuration, the second locking portions are respectively formed on the side walls provided at the two ends of the case in the axial direction, and the second locking portions are fit in the ring-shaped recesses in the covering member, which is a corrugated tube. Accordingly, the second locking portions can be locked to the ring-shaped protrusions at the two ends of the case in the axial direction, and thus it is possible to suppress movement of the electromagnetic wave absorbing member in the length direction of the covering member. As a result, it is possible to suppress displacement of the electromagnetic wave absorbing member in the length direction of the covering member.

[7] Preferably, the accommodation portion has a first wall portion and a second wall portion that extend in a direction intersecting with the length direction of the wire and are provided at an interval in the length direction of the wire, and the first wall portion and the second wall portion each face the electromagnetic wave absorbing member.

According to this configuration, the first wall portion and the second wall portion, which are provided at an interval in the length direction of the wire, face the electromagnetic wave absorbing member. Therefore, movement of the electromagnetic wave absorbing member in the length direction of the wire in the accommodation portion of the protector can be restricted by the first wall portion and the second wall portion. Accordingly, it is possible to restrict movement of the electromagnetic wave absorbing member in the protector. As a result, it is possible to suppress the occurrence of abnormal noise and impairment of the electromagnetic wave absorbing member due to contact between the electromagnetic wave absorbing member and the protector.

[8] Preferably, the covering member is provided so as to pass through the first wall portion and pass through the second wall portion.

According to this configuration, the wire is passed through the first wall portion in a state in which the wire is covered by the covering member, and the wire is passed through the second wall portion in a state in which the wire is covered by the covering member. Therefore, it is possible to interpose the covering member between the outer circumferential surface of the wire and the first wall portion, and to interpose the covering member between the outer circumferential surface of the wire and the second wall portion. Accordingly, it is possible to inhibit the first wall portion and the second wall portion from coming into direct contact with the outer circumferential surface of the wire. As a result, it is possible to suppress impairment of the wire due to the contact with the first wall portion and the second wall portion.

[9] Preferably, when the wire is a first wire, the wire harness further includes a second wire that is different from the first wire, in which the protector has a wire accommodation portion provided side-by-side with the accommodation portion and a partition configured to partition the accommodation portion and the wire accommodation portion from each other, the first wire passes through the accommodation portion, and the second wire passes through the wire accommodation portion.

According to this configuration, the first wire and the electromagnetic wave absorbing member provided on the first wire are accommodated in the accommodation portion, and the second wire is accommodated in the wire accommodation portion. Therefore, the electromagnetic wave absorbing member and the second wire are separately accommodated in the accommodation portion and the wire accommodation portion that are partitioned from each other by the partition. Accordingly, the partition can be interposed between the second wire and the electromagnetic wave absorbing member, and it is possible to inhibit the electromagnetic wave absorbing member from coming into direct contact with the outer circumferential surface of the second wire. As a result, it is possible to suppress impairment of the second wire due to the contact between the second wire and the electromagnetic wave absorbing member.

[10] Preferably, the first fixing member is a cable tie that has an elongated belt-shaped portion and a locking portion that is formed as a single body with the belt-shaped portion at a base end portion of the belt-shaped portion in a length direction of the belt-shaped portion.

According to this configuration, the electromagnetic wave absorbing member can be fastened and fixed to the protector by the cable tie that has the belt-shaped portion and the locking portion. The belt-shaped portion of the cable tie can be easily wrapped around the outer circumference of the electromagnetic wave absorbing member and the protector, and thus it is possible to improve the operability of assembling the wire harness.

Details of Embodiments of the Present Disclosure

A specific example of a wire harness according to this disclosure will be described with reference to the drawings below. In the drawings, some of the components may be exaggerated or simplified for the sake of description. Also, the dimensional proportions of some parts may differ from their actual proportions. "Parallel" and "orthogonal" in this specification include not only strictly parallel and orthogonal but also generally parallel and orthogonal in a range in which the effects of this embodiment are achieved. Note that the present disclosure is not limited to these examples, but is indicated by the claims, and all changes that come within the meaning and range of equivalency of the claims are intended to be embraced therein.

Overall Configuration of Wire Harness 10

A wire harness 10 shown in FIG. 1 electrically connects two electrical apparatuses (devices), or three or more electrical apparatuses (devices). The wire harness 10 is mounted in a vehicle V such as a hybrid vehicle or an electric vehicle, for example. The wire harness 10 includes a conductive path 20 that electrically connects a device M1 and a device M2, a conductive path 30 that electrically connects a device M3 and a device M4, and a protector 70.

The conductive path 20 is routed from the device M1 to the device M2 in a state in which a portion of the conductive path 20 in the length direction passes under the floor of the vehicle V, for example. An example of the device M1 is an inverter installed in the vicinity of a front portion of the vehicle V, and an example of the device M2 is a high-voltage battery installed in the vehicle V rearward of the device M1. The device M1 serving as an inverter is connected to a wheel driving motor (not shown), which serves as a power source for driving the vehicle, for example. The inverter generates AC power from DC power that is supplied from the high-voltage battery, and supplies the AC power to the motor. The device M2 serving as a high-voltage battery is a battery that can supply a voltage of several hundred volts, for example. That is, the conductive path 20 of this embodiment forms a high-tension circuit that enables high-voltage exchange between the high-voltage battery and the inverter.

The conductive path 30 is routed from the device M3 to the device M4 in a state in which a portion of the conductive path 30 in the length direction passes under the floor of the vehicle V, for example. An example of the device M3 is a relay box installed in the vicinity of a front portion of the vehicle V, and an example of the device M4 is a low-voltage battery installed in the vicinity of a rear portion of the vehicle V. The device M3 serving as the relay box distributes the voltage supplied from the low-voltage battery to various devices mounted in the vehicle V. The device M4 serving as the low-voltage battery is a battery that can supply a voltage (e.g., 12 volts) that is lower than the above-described high-voltage battery. That is, the conductive path 30 of this embodiment forms a low-tension circuit that can handle a low voltage supplied from the low-voltage battery.

The wire harness 10 includes a parallel wiring portion routed such that the conductive path 20 and the conductive path 30 extend in parallel with each other, and an individual wiring portion routed such that the conductive path 20 and the conductive path 30 extend in directions that are different from each other, for example. The conductive path 20 and the conductive path 30 are arranged side-by-side in the parallel wiring portion. A portion of the parallel wiring portion in the length direction thereof is routed under the floor of the vehicle V, for example.

Figure 2:
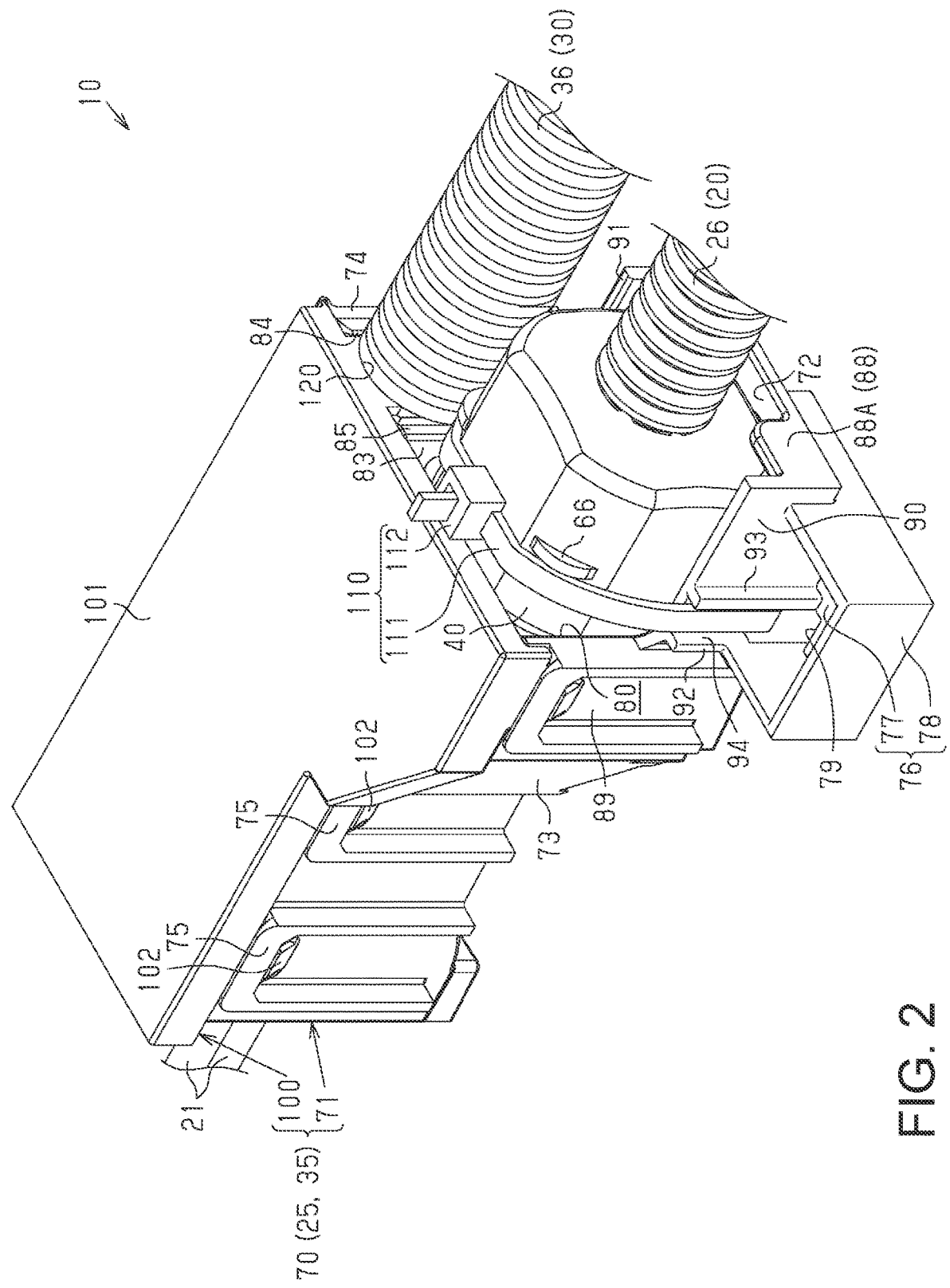
FIG. 2 is a schematic perspective view showing a wire harness according to an embodiment.
Figure 3:
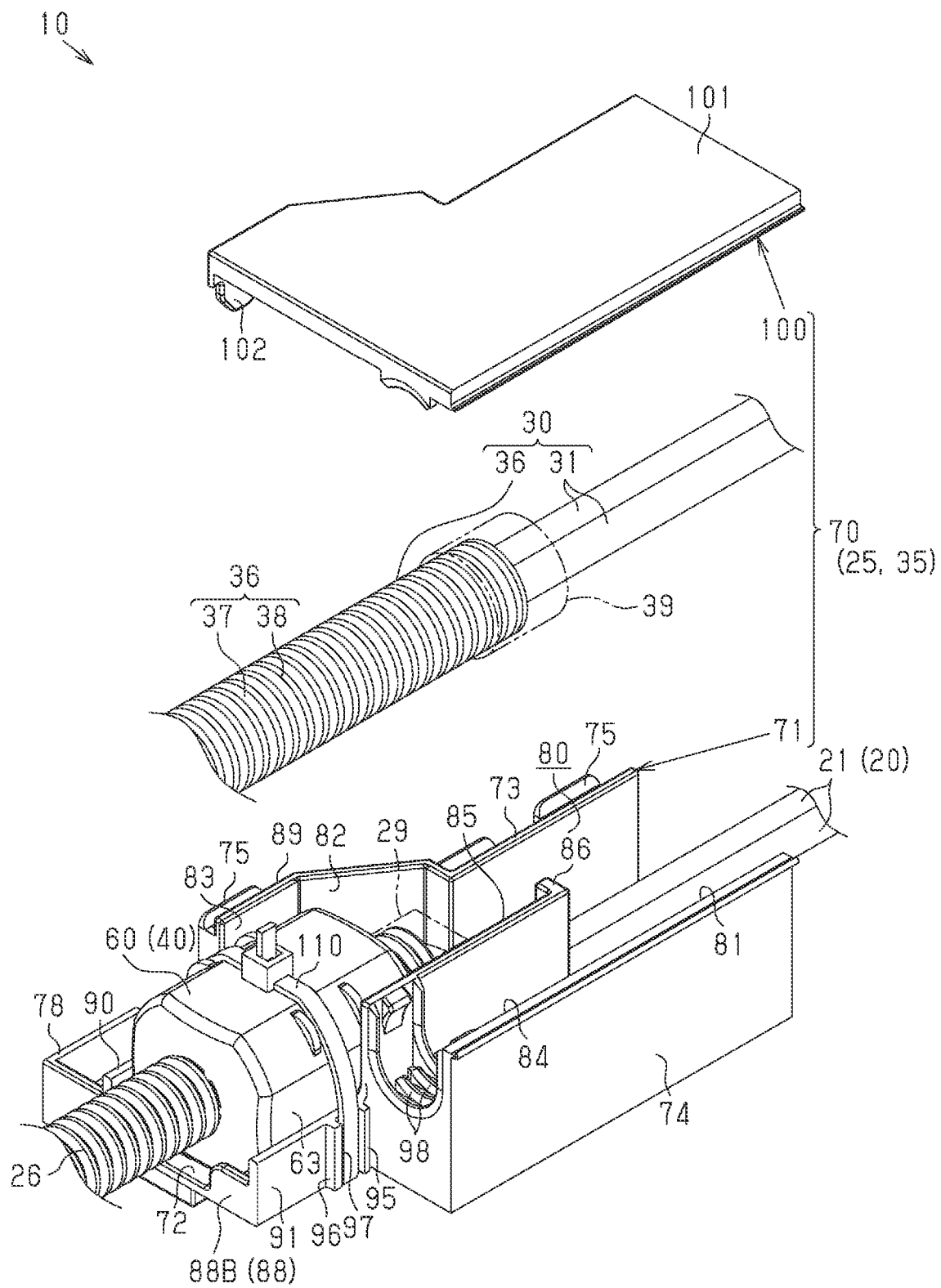
FIG. 3 is a schematic exploded perspective view showing a wire harness according to an embodiment.
Figure 4:
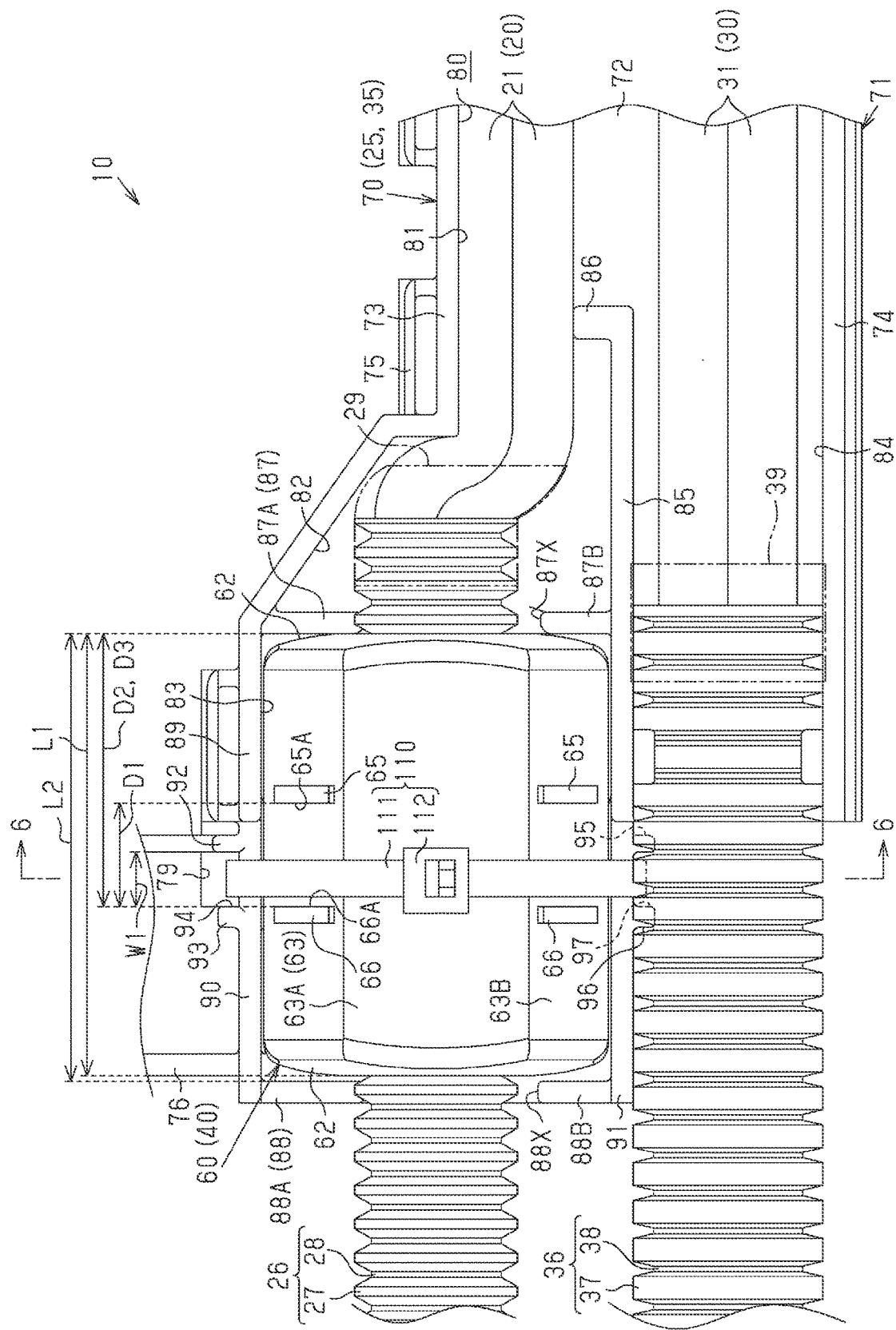
FIG. 4 is a schematic plan view showing a wire harness according to an embodiment.

As shown in FIGS. 1 to 5, the protector 70 is provided in the parallel wiring portion, for example. As shown in FIGS. 2 to 4, the protector 70 is provided so as to accommodate a portion of the conductive path 20 in the length direction and to accommodate a portion of the conductive path 30 in the length direction. The wire harness 10 has the electromagnetic wave absorbing member 40 (electromagnetic wave absorber) provided on a portion of the conductive path 20 in the length direction, for example. The electromagnetic wave absorbing member 40 is accommodated in the protector 70. As shown in FIGS. 2 and 4, the wire harness 10 includes a fixing member 110 that fixes the electromagnetic wave absorbing member 40 to the protector 70.

Configuration of Conductive Path 20

As shown in FIG. 1, the conductive path 20 includes one or more (two in the embodiment) wires 21, a pair of connectors C1 respectively attached to two end portions of the wires 21, and an outer cover member 25 collectively enclosing the plurality of wires 21. End portions on one side of the wires 21 are connected to the device M1 via one of the connectors C1, and end portions on the other side of the wires 21 are connected to the device M2 via the other connector C1. Each wire 21 is elongated to extend in the front-rear direction of the vehicle V, for example. Each wire 21 is formed so as to be bent into a two-dimensional shape or three-dimensional shape in accordance with the wiring route of the conductive path 20, for example. The wires 21 in this embodiment are high-voltage wires that can handle high voltages and large currents, for example. The wires 21 may be shielded wires that have an electromagnetically shielded structure, or may be non-shielded wires that have no electromagnetically shielded structure.

Configuration of Wire 21

Figure 6:
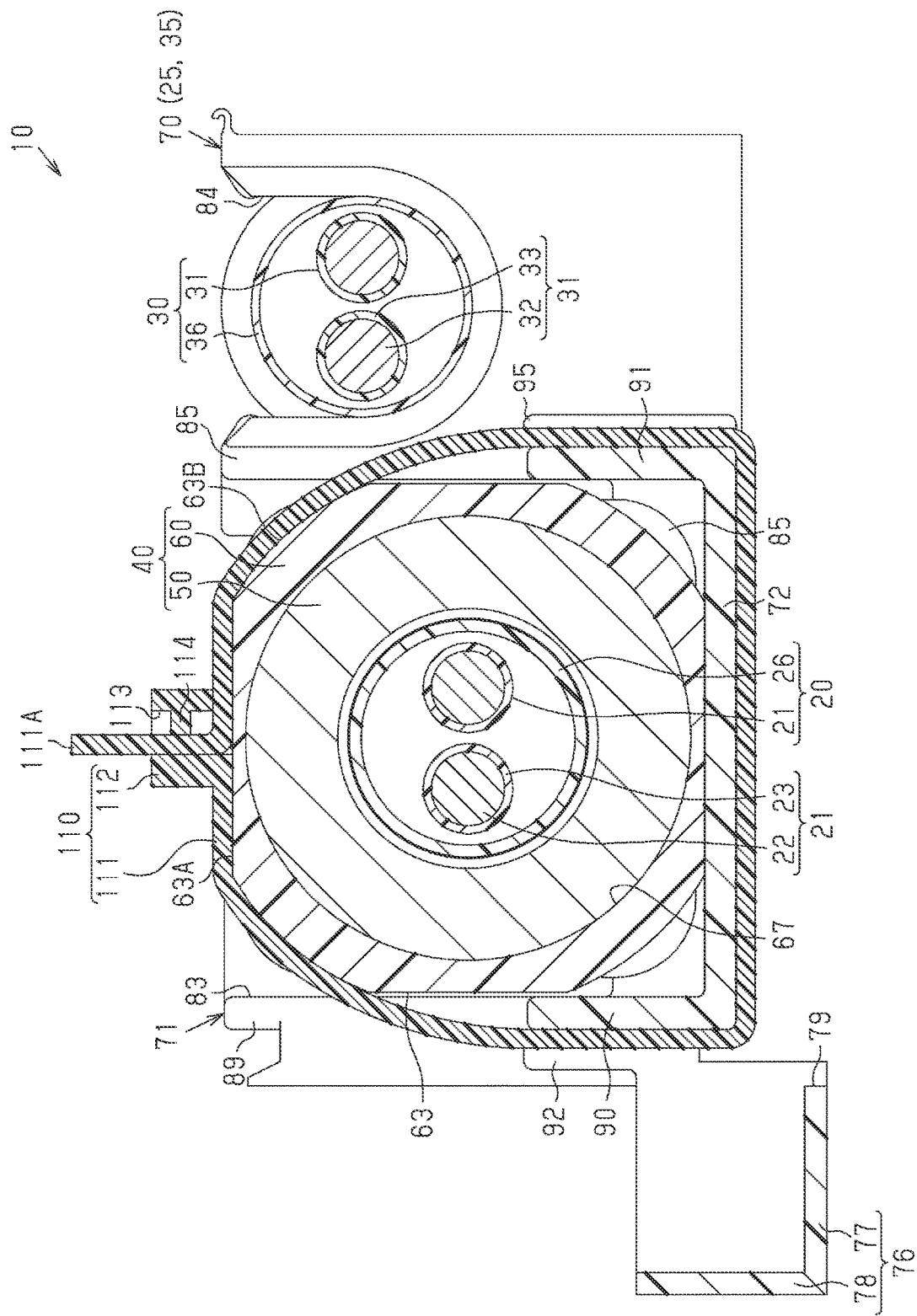
FIG. 6 is a schematic transverse cross-sectional view (a cross-sectional view taken along line 6-6 in FIG. 4) showing a wire harness according to an embodiment.

As shown in FIG. 6, the wires 21 are coated wires each including a core wire 22 formed by a conductor and an insulating sheath 23 that covers the outer circumference of the core wire 22.

Configuration of Core Wire 22

A twisted wire obtained by twisting a plurality of bare metal wires together, a columnar conductor constituted by one columnar metal rod that is solid, or a tubular conductor that is hollow can be used as the core wire 22, for example. A twisted wire, a columnar conductor, and a tubular conductor may be used in combination as the core wire 22, for example. Examples of the columnar conductor include a single core wire and a bus bar. The core wires 22 in this embodiment are twisted wires. A metallic material such as a copper-based material or an aluminum-based material can be used as the material of the core wires 22, for example.

The cross-sectional shape (i.e., a transverse cross-sectional shape) obtained by cutting a core wire 22 along a plane orthogonal to the length direction of the core wire 22 may be any shape. The transverse cross-sectional shape of each core wire 22 is a circular, semicircular, polygonal, square, or flat shape, for example. The transverse cross-sectional shape of the core wire 22 in this embodiment is a circular shape.

Configuration of Insulating Sheath 23

The insulating sheaths 23 respectively cover the entire outer circumferential surfaces of the core wires 22, for example. The insulating sheath 23 is made of an insulating material such as a synthetic resin, for example. It is possible to use a synthetic resin containing polyolefin-based resin as a main component, such as crosslinked polyethylene or crosslinked polypropylene, as the material of the insulating sheath 23, for example. Materials of one or more types can be used alone or in combination of two or more as the material of the insulating sheath 23. The insulating sheath 23 can be formed through, for example, extrusion molding (extrusion coating) performed on the core wire 22.

Configuration of Outer Cover Member 25

The outer cover member 25 shown in FIG. 1 has an overall elongated tubular shape. The wires 21 are accommodated in an internal space of the outer cover member 25. A metal pipe or resin pipe, a resin protector, a flexible corrugated tube made of resin or the like, a waterproof rubber cover, or a combination thereof may be used as the outer cover member 25, for example. A metallic material such as a copper-based material, an iron-based material, or an aluminum-based material can be used as the material of a metal pipe. A conductive resin material or a resin material that has no conductivity can be used as the material of a resin protector or a resin corrugated tube, for example. It is possible to use a synthetic resin such as polyolefin, polyamide, polyester, or an ABS resin, as this resin material, for example.

As shown in FIG. 3, the outer cover member 25 includes a covering member 26 (cover) and the protector 70, for example.

Configuration of Covering Member 26

The covering member 26 is provided so as to cover outer circumferences of portions of the wires 21 in the length direction, for example. The covering member 26 is provided so as to cover portions of the wires 21 accommodated in the protector 70 and portions of the wires 21 that are led out from the protector 70, for example. The covering member 26 is provided so as to be inserted into the protector 70 from the outside of the protector 70, for example. The covering member 26 has an overall tubular shape so as to collectively enclose the outer circumference of the plurality of wires 21, for example. The covering member 26 has a tubular shape in which two ends of the covering member 26 in the length direction of the wires 21 are open, for example. The covering member 26 is provided so as to enclose the entire outer circumference of the plurality of the wires 21 in the circumferential direction, for example. The covering member 26 in this embodiment has a cylindrical shape. It is possible to use an outer cover member whose outer circumferential surface has an uneven shape (the first locking portions/first locks) as the covering member 26, for example. The covering member 26 in this embodiment is a corrugated tube made of a synthetic resin.

Note that, in the following description, when a direction is simply mentioned as the "length direction", the length direction refers to a direction in which the central axis of the wire 21 extends, and when a direction is simply mentioned as the "circumferential direction", the circumferential direction refers to a circumferential direction of the central axis of the wire 21.

Figure 7:
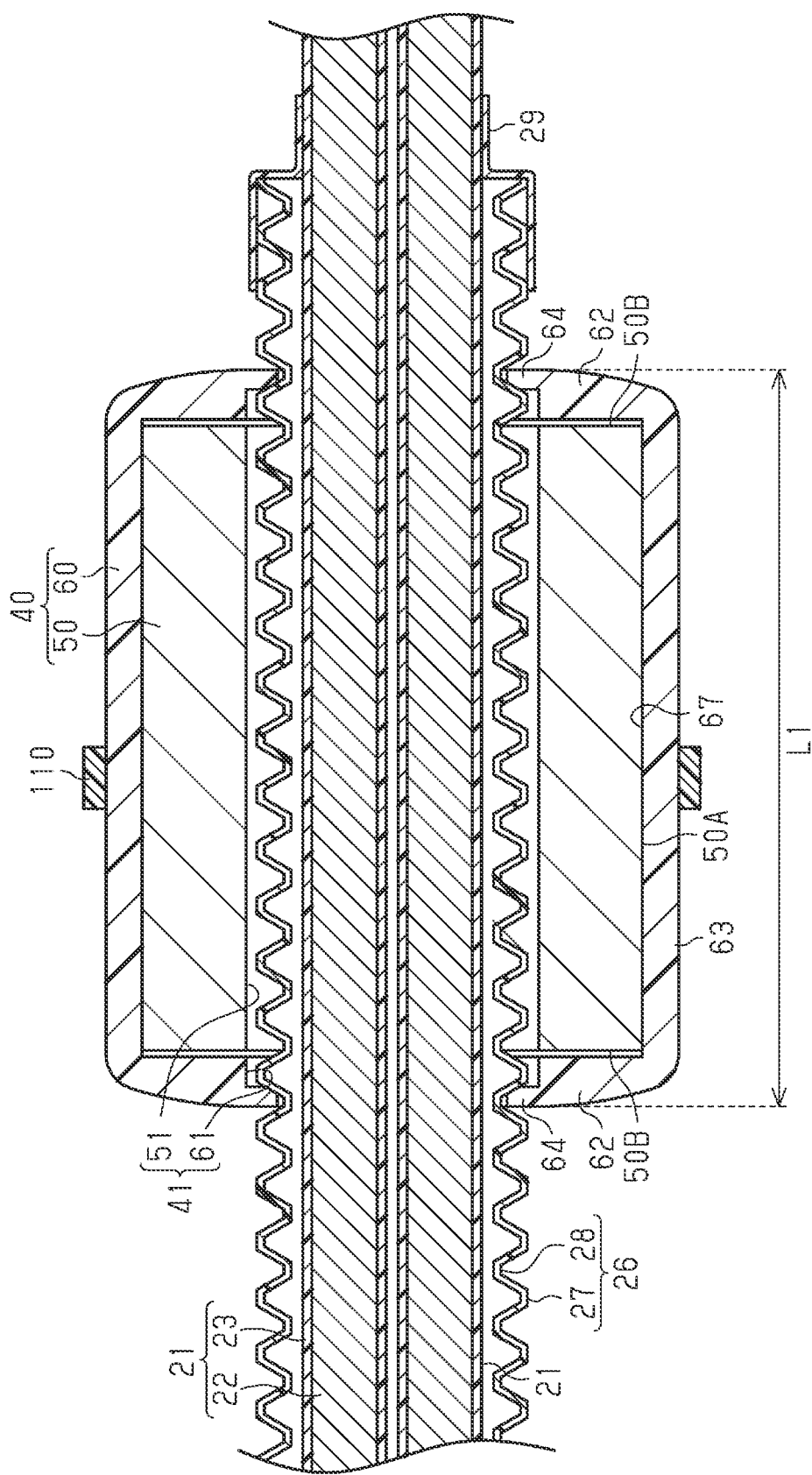
FIG. 7 is a schematic cross-sectional view showing a wire harness according to an embodiment.

As shown in FIG. 7, the covering member 26 has an accordion structure in which ring-shaped protrusions 27 and ring-shaped recesses 28 are arranged alternatingly in the axial direction (length direction) in which the central axis of the covering member 26 extends, for example. A conductive resin material or a resin material that has no conductivity can be used as the material of the covering member 26, for example. It is possible to use a synthetic resin such as polyolefin, polyamide, polyester, or an ABS resin, as this resin material, for example.

The covering member 26 may or may not have a slit extending in the axial direction of the covering member 26, for example. The covering member 26 in this embodiment has a tubular shape so as to collectively enclose the outer circumference of the plurality of wires 21 without having a slit extending in the axial direction thereof.

The covering member 26 is provided so as to pass through the electromagnetic wave absorbing member 40 in the length direction, for example. The covering member 26 is provided so as to pass through the electromagnetic wave absorbing member 40 in a state in which the covering member 26 covers the plurality of wires 21, for example. The two end portions of the covering member 26 in the length direction thereof are led out from the electromagnetic wave absorbing member 40, for example. The two end portions of the covering member 26 in the length direction thereof are exposed from the electromagnetic wave absorbing member 40, for example. One end portion of the covering member 26 in the length direction is fixed to the outer circumference of the wires 21, for example. The one end portion of the covering member 26 in the length direction thereof is fixed to the outer circumferential surface of the wires 21 by the fixing member 29 in the vicinity of the electromagnetic wave absorbing member 40, for example. Accordingly, it is possible to suppress displacement of the covering member 26 in the length direction of the wires 21 because the covering member 26 is fixed to the outer circumferential surface of the wires 21. Here, "vicinity" in this specification refers to a range within a length (3×L1) that is three times a length L1 of the electromagnetic wave absorbing member 40 in the length direction from the end of A in the case of the vicinity of A, for example.

Configuration of Fixing Member 29

The fixing member 29 is formed so as to fix an end portion of the covering member 26 in the length direction to the outer circumferential surface of the wires 21, for example. The fixing member 29 functions to restrict the movement of the covering member 26 in the length direction of the wires 21, for example. A tape member, a cable tie, a crimp band, or the like can be used as the fixing member 29, for example. The fixing member 29 in this embodiment is a tape member having an adhesive layer on one surface thereof.

The fixing member 29 is wound around the outer circumferential surface of an end portion in the length direction of the covering member 26 and an outer circumferential surface of the wires 21 exposed from the covering member 26, for example. The fixing member 29 is wound continuously from the outer circumferential surface of an end portion in the length direction of the covering member 26 to the outer circumferential surface of the wires 21, for example. The fixing member 29 has an overlapping winding structure, for example. Here, an "overlapping winding structure" refers to a structure in which the fixing member 29 is helically wound such that predetermined portions thereof in the width direction of the fixing member 29 overlap each other. A half-lap winding structure is preferable as an overlapping winding structure, for example. Here, a "half-lap winding structure" refers to a structure in which the fixing member 29 is helically wound such that portions thereof, which are substantially the half in the width direction of the fixing member 29, overlap each other.

Configuration of Conductive Path 30

As shown in FIG. 1, the conductive path 30 includes one or more (two in the embodiment) wires 31, and an outer cover member 35 enclosing the outer circumference of the plurality of wires 31, for example. End portions on one side of the wires 31 are connected to the device M3, and end portions on the other side of the wires 31 are connected to the device M4, for example. Each wire 31 is elongated to extend in the front-rear direction of the vehicle V, for example. Each wire 31 is formed so as to be bent into a two-dimensional shape or three-dimensional shape in accordance with the wiring route of the conductive path 30, for example. The wires 31 in this embodiment are low-voltage wires that can handle low voltages, for example. The wires 31 may be shielded wires that have an electromagnetically shielded structure, or may be non-shielded wires that have no electromagnetically shielded structure.

Configuration of Wire 31

As shown in FIG. 6, the wires 31 are coated wires each including a core wire 32 formed by a conductor and an insulating sheath 33 that covers the outer circumference of the core wire 32.

Configuration of Core Wire 32

A twisted wire, a columnar conductor, a tubular conductor, or the like may be used as the core wire 32, for example. A twisted wire, a columnar conductor, and a tubular conductor may be used in combination as the core wire 32, for example. Examples of the columnar conductor include a single core wire and a bus bar. The core wire 32 in this embodiment is a twisted wire. A metallic material such as a copper-based material or an aluminum-based material can be used as the material of the core wires 32, for example.

The transverse cross-sectional shape of the core wire 32 may be any shape. The transverse cross-sectional shape of the core wire 32 is a circular, semicircular, polygonal, square, or flat shape, for example. The transverse cross-sectional shape of the core wire 32 in this embodiment is a circular shape.

Configuration of Insulating Sheath 33

The insulating sheaths 33 respectively cover the entire outer circumferential surfaces of the core wires 32 in the circumferential direction, for example. The insulating sheath 33 is made of an insulating material such as a synthetic resin, for example. It is possible to use a synthetic resin containing polyolefin-based resin as a main component, such as crosslinked polyethylene or crosslinked polypropylene, as the material of the insulating sheath 33, for example. Materials of one or more types can be used alone or in combination of two or more as appropriate as the material of the insulating sheath 33. The insulating sheath 33 can be formed through, for example, extrusion molding (extrusion coating) performed on the core wire 32.

Configuration of Outer Cover Member 35

The outer cover member 35 shown in FIG. 1 has an overall elongated tubular shape. The wires 31 are accommodated in an internal space of the outer cover member 35. A metal pipe or resin pipe, a resin protector, a flexible corrugated tube made of resin or the like, a waterproof rubber cover, or a combination thereof may be used as the outer cover member 35, for example.

As shown in FIG. 2, the outer cover member 35 includes the covering member 36 and the protector 70, for example. The protector 70 in this embodiment constitutes a portion of the outer cover member 25 and constitutes a portion of the outer cover member 35.

Configuration of Covering Member 36

As shown in FIG. 3, the covering member 36 is provided so as to cover outer circumferences of portions of the wires 31 in the length direction, for example. The covering member 36 is provided so as to cover portions of the wires 31 accommodated in the protector 70 and portions of the wires 31 that are led out from the protector 70, for example. The covering member 36 is provided so as to be inserted into the protector 70 from the outside of the protector 70, for example. The covering member 36 has an overall tubular shape so as to collectively enclose the outer circumference of the plurality of wires 31, for example. The covering member 36 has a tubular shape in which two ends of the covering member 36 in the length direction of the wires 31 are open, for example. The covering member 36 is provided so as to enclose the entire outer circumference of the plurality of the wires 31 in the circumferential direction, for example. The covering member 36 in this embodiment has a cylindrical shape. The covering member 36 in this embodiment is a corrugated tube made of a synthetic resin.

The covering member 36 has an accordion structure in which ring-shaped protrusions 37 and ring-shaped recesses 38 are arranged alternatingly in the axial direction (length direction) in which the central axis of the covering member 36 extends, for example. One end portion of the covering member 36 in the length direction thereof is fixed to the outer circumference of the wires 31 by the fixing member 39, for example. One end portion of the covering member 36 in the length direction thereof is fixed to the outer circumferential surface of the wires 31 in the protector 70, for example. Accordingly, it is possible to suppress displacement of the covering member 36 in the length direction of the wires 31 because the covering member 36 is fixed to the outer circumferential surface of the wires 31.

A conductive resin material or a resin material that has no conductivity can be used as the material of the covering member 36, for example. It is possible to use a synthetic resin such as polyolefin, polyamide, polyester, or an ABS resin, as this resin material, for example. The covering member 36 may or may not have a slit extending in the axial direction of the covering member 36, for example. The covering member 36 in this embodiment has a tubular shape so as to collectively enclose the outer circumference of the plurality of wires 31 without having a slit extending in the axial direction thereof.

Configuration of Fixing Member 39

The fixing member 39 is formed so as to fix an end portion of the covering member 36 in the length direction to the outer circumferential surface of the wires 31, for example. The fixing member 39 functions to restrict the movement of the covering member 36 in the length direction of the wires 31, for example. A tape member, a cable tie, a crimp band, or the like can be used as the fixing member 39, for example. The fixing member 39 in this embodiment is a tape member having an adhesive layer on one surface thereof.

The fixing member 39 is wound around the outer circumferential surface of an end portion in the length direction of the covering member 36 and an outer circumferential surface of the wires 31 exposed from the covering member 36, for example. The fixing member 39 is wound continuously from the outer circumferential surface of the covering member 36 to the outer circumferential surface of the wires 31, for example. The fixing member 39 has an overlapping winding structure, for example. The fixing member 39 has a half-lap winding structure, for example.

Configuration of Electromagnetic Wave Absorbing Member 40

As shown in FIGS. 3 and 4, the electromagnetic wave absorbing member 40 is provided at a portion of the conductive path 20 in the length direction. The electromagnetic wave absorbing member 40 is provided at portions of the wires 21 in the length direction. The electromagnetic wave absorbing member 40 is provided on the outer circumference of the portions of the wires 21 accommodated in the protector 70, for example. The electromagnetic wave absorbing member 40 is provided on the outer circumference of the covering member 26, for example. The electromagnetic wave absorbing member 40 is provided so as to enclose an outer circumference of a portion of the covering member 26 in the length direction, for example. The electromagnetic wave absorbing member 40 is provided so as to enclose the entire outer circumference of the covering member 26 in the circumferential direction, for example. The electromagnetic wave absorbing member 40 is provided so as to collectively enclose the outer circumference of the plurality of wires 21, for example. The electromagnetic wave absorbing member 40 is accommodated in the protector 70, for example. As shown in FIG. 2, a portion of the electromagnetic wave absorbing member 40 is exposed from the protector 70, for example.

As shown in FIG. 7, the electromagnetic wave absorbing member 40 has a through-hole 41 through which the plurality of wires 21 collectively pass, for example. The electromagnetic wave absorbing member 40 has a ring shape due to having the through-hole 41, for example. The through-hole 41 is formed so as to pass through the electromagnetic wave absorbing member 40 in the length direction of the wires 21, for example. The plurality of wires 21 are provided so as to pass through the through-hole 41, for example. The covering member 26 is provided so as to pass through the through-hole 41 in a state in which the covering member 26 collectively encloses the outer circumference of the plurality of wires 21, for example.

Here, a "ring" in this specification includes a circular ring whose outer edge has a circular shape, a ring whose outer edge has an elliptical or oval shape, a polygonal ring whose outer edge has a polygonal shape, and a ring whose outer edge has a rounded polygonal shape, and a "ring" refers to any ring whose outer edge has any closed shape connected by straight lines or curved lines. A "ring" includes a ring with a shape having a through-hole in a plan view, and a shape whose outer edge has the same shape as the inner circumferential shape of the through-hole and a shape whose outer edge has a shape that is different from the inner circumferential shape of the through-hole. A "ring" includes a ring that has a predetermined length extending in a direction in which the through-hole passes therethrough, and the magnitude of the length thereof is not limited. Also, a "ring shape" in this specification need only be regarded as a ring overall, and includes a shape that includes a notch or the like in a portion thereof, such as a C-shape. The electromagnetic wave absorbing member 40 has the through-hole 41 in a plan view when viewed in the length direction of the wires 21, and has a ring shape having a predetermined length extending in the direction in which the through-hole 41 passes therethrough, for example.

The electromagnetic wave absorbing member 40 includes a ring-shaped magnetic core 50 and a ring-shaped case 60 that accommodates the magnetic core 50, for example. The magnetic core 50 has a through-hole 51 through which the plurality of wires 21 collectively pass. The case 60 has a through-hole 61 through which the plurality of wires 21 collectively pass. The through-hole 41 in the electromagnetic wave absorbing member 40 is constituted by the through-hole 51 and the through-hole 61.

Configuration of Magnetic Core 50

The magnetic core 50 has a ring shape due to having the through-hole 51, for example. The magnetic core 50 has a ring shape in which two ends of the magnetic core 50 in the length direction of the wires 21 are open, for example. The magnetic core 50 in this embodiment has a circular ring shape. The through-hole 51 is formed so as to pass through the magnetic core 50 in the length direction, for example.

Because the magnetic core 50 is disposed so as to face the wires 21 over the entire circumference of the wires 21 in the circumferential direction, the magnetic core 50 functions to reduce electromagnetic waves (electromagnetic noise) emitted from the wires 21, for example. The magnetic core 50 absorbs electromagnetic waves emitted from the wires 21, and converts the energy of the electromagnetic waves into mechanical energy such as vibration or thermal energy, for example. This reduces the adverse effects of the magnetic waves emitted from the wires 21 on peripheral devices and the like.

Here, "facing" in this specification refers to surfaces or members being located in front of each other, and not only a case where surfaces or members are located completely in front of each other but also a case where they are located partially in front of each other. Also, "facing" in this specification includes a case where a member other than two portions is interposed between the two portions, and a case where nothing is interposed between the two portions.

The magnetic core 50 is a molded body containing a soft magnetic material, for example. Examples of the soft magnetic material include iron (Fe), an iron alloy, and ferrite. Examples of the iron alloys include Fe-silicon (Si) alloys and Fe-nickel (Ni) alloys. A ferrite core, an amorphous core, or a permalloy core can be used as the magnetic core 50, for example. The ferrite core is made of soft ferrite exhibiting soft magnetism, for example. Examples of the soft ferrite include ferrite containing nickel (Ni) and zinc (Zn) and ferrite containing manganese (Mn) and zinc (Zn). The material of the magnetic core 50 can be selected as appropriate according to the frequency band of electromagnetic noise to be reduced, for example.

As shown in FIG. 6, the magnetic core 50 in this embodiment is formed continuously over the entire circumference of the magnetic core 50 in the circumferential direction, and has a closed ring shape. That is, a slit, which extends in the axial direction of the magnetic core 50, is not formed in the magnetic core 50 in this embodiment. The magnetic core 50 in this embodiment is composed of one component. Note that, although the magnetic core 50 is composed of one component in this embodiment, the magnetic core 50 may be formed by combining multiple core members into a ring shape. The magnetic core 50 may be formed in a circular ring shape by combining two core members that have semicircular transverse cross-sections, for example.

As shown in FIG. 7, the magnetic core 50 has an outer circumferential surface 50A extending in the circumferential direction and the axial direction of the magnetic core 50, and two side surfaces 50B that are located at the two ends in the axial direction of the magnetic core 50 and extend in the radial direction of the magnetic core 50, for example. The two side surfaces 50B are provided between the outer circumferential surface 50A and the inner circumferential surface of the through-hole 51, for example.

Configuration of Case 60

The case 60 has a ring shape due to having the through-hole 61, for example. The case 60 has a ring shape in which two ends of the case 60 in the length direction of the wires 21 are open, for example. The case 60 in this embodiment has a circular ring shape. The through-hole 61 is formed so as to pass through the case 60 in the length direction, for example. The covering member 26 is provided so as to pass through the through-hole 61 in a state in which the covering member 26 collectively encloses the outer circumference of the plurality of wires 21, for example. The covering member 26 in this embodiment is provided so as to pass through the through-hole 41 in the electromagnetic wave absorbing member 40 constituted by the through-holes 51 and 61.

Figure 8:
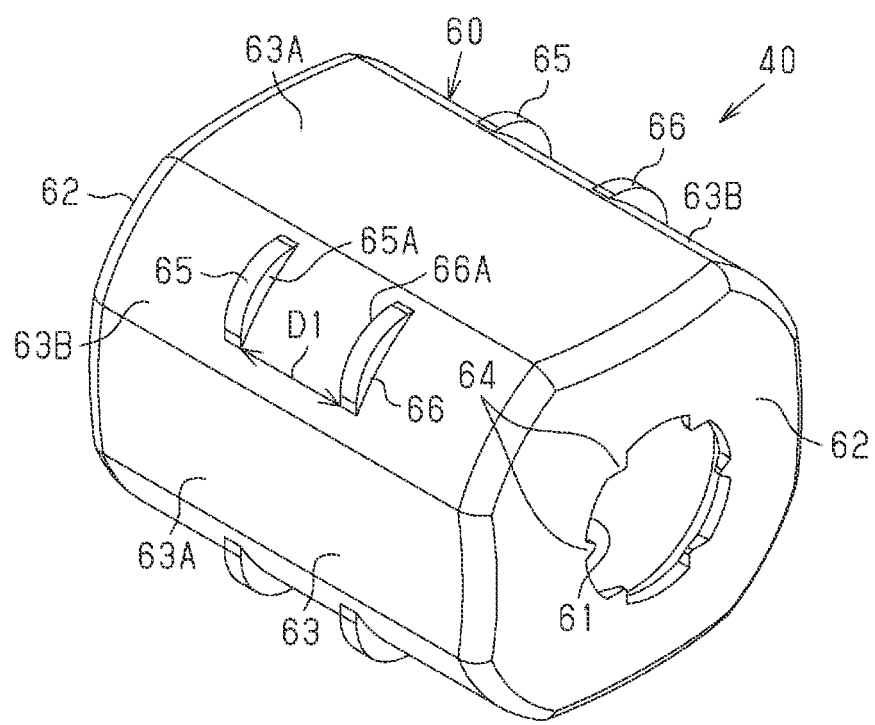
FIG. 8 is a schematic perspective view showing an electromagnetic wave absorbing member according to an embodiment.

As shown in FIG. 8, the case 60 has a polygonal ring shape, for example. The case 60 in this embodiment has an octagonal ring shape. As shown in FIG. 6, the transverse cross-sectional shape of the case 60 is formed in a polygonal shape such as a quadrangle or a higher polygon, for example. The transverse cross-sectional shape of the case 60 in this embodiment is formed in an octagonal shape.

As shown in FIG. 8, the case 60 has two side walls 62 that are located at two ends in the axial direction of the case 60 and extend in the radial direction of the case 60, a circumferential wall 63 that extends in the circumferential direction and the axial direction of the case 60, and pairs of protruding portions 65 and 66 that are formed on the outer circumferential surface of the circumferential wall 63, for example.

The shape of each side wall 62 when viewed in the direction in which the through-hole 61 passes therethrough is a polygonal shape, for example. The shape of each side wall 62 in this embodiment when viewed in the direction in which the through-hole 61 passes therethrough is formed in an octagonal shape, for example. As shown in FIG. 7, each side wall 62 is provided with the through-hole 61 that passes through the side wall 62 in the axial direction. The inner circumferential shape of the through-hole 61 is formed in a shape corresponding to the outer circumferential shape of the covering member 26, for example. The inner circumferential shape of the through-hole 61 is formed in a shape corresponding to the outer circumferential shape of the ring-shaped protrusions 27 on the covering member 26, for example. The shape of the through-hole 61 in this embodiment when viewed in the direction in which the through-hole 61 passes therethrough is formed in a circular shape.

Each side wall 62 has locking portions 64 that fit in the ring-shaped recesses 28 in the covering member 26, for example. The locking portions 64 are provided so as to be locked to ring-shaped protrusions 27 in the length direction of the covering member 26, for example. Due to the locking portions 64 and the ring-shaped protrusions 27 being locked to each other, it is possible to restrict the movement of the case 60 in the length direction of the covering member 26.

Leading end surfaces of the locking portions 64 are formed so as to be in contact with the outer circumferential surfaces of the ring-shaped recesses 28, for example. Each locking portion 64 is held by side surfaces of the ring-shaped protrusions 27 from both sides in the length direction, for example. The locking portion 64 faces the side surfaces of the ring-shaped protrusions 27, for example. The locking portion 64 is in contact with the side surfaces of the ring-shaped protrusions 27, for example.

As shown in FIG. 8, the locking portions 64 protrude inward from the inner circumferential surface of the through-hole 61 in the radial direction of the case 60, for example. A plurality (six in this embodiment) of locking portions 64 are formed on the inner circumferential surface of the through-hole 61 at predetermined intervals in the circumferential direction of the through-hole 61, for example. Note that the locking portions 64 may be formed continuously over the entire circumference of the through-hole 61 in the circumferential direction thereof, for example.

The circumferential wall 63 is formed so as to extend in the axial direction of the case 60 between two side walls 62, for example. The circumferential wall 63 is constituted by a plurality (four in this embodiment) of circumferential walls 63A and a plurality (four in this embodiment) of circumferential walls 63B, for example. The circumferential wall 63 is constituted by the eight circumferential walls 63A and 63B that respectively correspond to the sides of the side wall 62 forming an octagonal shape, for example. The circumferential walls 63A and the circumferential walls 63B are provided alternatingly in the circumferential direction of the case 60, for example. The circumferential walls 63A and the circumferential walls 63B are formed continuously with each other as a single body, for example. The circumferential walls 63A and 63B are formed so as to extend in the axial direction of the case 60 between two side walls 62, for example. The circumferential walls 63A are formed in a planar shape, for example. The circumferential walls 63B are formed in a curved surface shape, for example. The outer circumferential surface of the circumferential walls 63B is a curved surface, for example.

The protruding portions 65 and 66 are formed on the outer circumferential surface of each circumferential wall 63B, for example. A pair of protruding portions 65 and 66, which are provided at a predetermined interval in the axial direction of the case 60, are formed on the outer circumferential surface of each circumferential wall 63B, for example. The protruding portions 65 and 66 are formed so as to protrude outward from the outer circumferential surface of each circumferential wall 63B in the radial direction of the case 60, for example. The protruding portions 65 and 66 are formed so as to extend in the circumferential direction of the case 60, for example. The protruding portions 65 and 66 are formed on a portion of the outer circumferential surface of the circumferential wall 63B in the circumferential direction, for example. The two protruding portions 65 and 66 are formed so as to face each other, for example. The protruding portion 65 has an opposing surface 65A that faces the protruding portion 66, for example. The protruding portion 66 has an opposing surface 66A that faces the protruding portion 65, for example.

As shown in FIG. 7, the case 60 has an accommodation portion 67 (accommodation) that accommodates the magnetic core 50. The accommodation portion 67 has a size large enough to be able to accommodate the magnetic core 50. The accommodation portion 67 is formed so as to be in communication with the through-hole 61, for example. The accommodation portion 67 is constituted by the space surrounded by the inner circumferential surfaces of the side walls 62 and the inner circumferential surface of the circumferential wall 63, for example. The accommodation portion 67 is formed so as to enclose the outer circumferential surface 50A of the magnetic core 50, for example. The inner circumferential surface of the circumferential wall 63 is formed so as to face the outer circumferential surface 50A of the magnetic core 50, for example. The accommodation portion 67 is formed so as to enclose the side surfaces 50B of the magnetic core 50, for example. The inner circumferential surfaces of the side walls 62 are formed so as to respectively face the side surfaces 50B of the magnetic core 50, for example.

The case 60 of this embodiment is attached to the outer circumference of the covering member 26 by fitting the locking portions 64 in the ring-shaped recesses 28 in the covering member 26 in a state in which the magnetic core 50 is accommodated in the accommodation portion 67. At this time, the magnetic core 50 is held by the accommodation portion 67 of the case 60 and the outer circumferential surface of the covering member 26, for example.

The case 60 may or may not have a slit extending in the axial direction of the case 60, for example. The case 60 may be constituted by one component, or may be constituted by combining multiple components.

Note that the case 60 is composed of an insulating material such as a synthetic resin, for example. It is possible to use a synthetic resin such as polyolefin, polyamide, polyester, or an ABS resin, as the material of the case 60, for example.

Configuration of Protector 70

As shown in FIGS. 2 and 3, the protector 70 is formed so as to accommodate a portion of the conductive path 20 in the length direction and to accommodate a portion of the conductive path 30 in the length direction, for example. The protector 70 has a higher rigidity than the covering members 26 and 36, for example. The protector 70 has a protector main body 71 and a cover 100 that is attached to the protector main body 71, for example. In the protector 70 in this embodiment, the protector main body 71 and the cover 100 are formed as separate components. The cover 100 is formed to be detachable from the protector main body 71, for example. The protector main body 71 and the cover 100 are composed of an insulating material such as a synthetic resin, for example. It is possible to use a synthetic resin such as polyolefin, polyamide, polyester, or an ABS resin, as the materials of the protector main body 71 and the cover 100, for example. The material of the protector main body 71 and the material of the cover 100 may be of the same type or different types, for example.

Schematic Configuration of Protector Main Body 71

As shown in FIG. 3, the protector main body 71 has a bottom wall portion 72, and side wall portions 73 and 74 that protrude upward in FIG. 3 from both sides in the width direction of the bottom wall portion 72, for example. The bottom wall portion 72 and the side wall portions 73 and 74 constitute a path 80 having a recessed cross-section through which the conductive paths 20 and 30 are passed, for example. That is, the path 80 is constituted by the space surrounded by the bottom wall portion 72 and the side wall portions 73 and 74. The path 80 has a groove shape and is formed so as to pass through the protector main body 71 in the length direction of the wires 21 and 31, for example. The path 80 is formed so as to be open in a direction (the upper side in FIG. 3) that intersects with the length direction of the wires 21 and 31, for example. That is, the two side wall portions 73 and 74 are not connected to each other at an upper end portion opposite to the bottom wall portion 72. The plurality of wires 21 and the plurality of wires 31 are passed through the path 80, for example. The two side wall portions 73 and 74 face each other with the accommodation space (i.e., the path 80) of the conductive paths 20 and 30 interposed therebetween, for example. The outer circumferential surface of the side wall portion 73 is provided with one or more locking portions 75, for example.

Here, in this specification, a direction orthogonal to the length direction of the wires 21 and 31 in the protector 70, specifically, the direction in which the side wall portions 73 and 74 are aligned, is referred to as a "width direction".

As shown in FIG. 2, the protector main body 71 has a protruding portion 76 (protrusion) that protrudes outward from the outer circumferential surface of the side wall portion 73 at one end portion of the protector main body 71 in the length direction, for example. The protruding portion 76 has a plate-shaped bottom wall portion 77 and an outer circumferential wall 78 formed so as to extend upward from the outer circumferential edge of the bottom wall portion 77 so as to have a box shape, for example. The bottom wall portion 77 has a through-hole 79 that passes through the bottom wall portion 77 in the thickness direction, for example. The through-hole 79 is provided adjacent to the side wall portion 73, for example.

Configuration of Cover 100

The cover 100 is attached to the protector main body 71 to cover the opening in the path 80, for example. The cover 100 is attached to the protector main body 71 such that the opening in the path 80 is partially exposed, for example. The cover 100 is attached to the protector main body 71 such that a portion of the electromagnetic wave absorbing member 40 accommodated in the protector main body 71 is exposed, for example.

As shown in FIG. 3, the cover 100 has an opposing wall 101 that faces the bottom wall portion 72 and the side wall portions 73 and 74, and one or more locking portions 102 formed on the inner circumferential surface (here, the lower surface) of the opposing wall 101, for example. The cover 100 is a single component in which the opposing wall 101 and the locking portions 102 are formed as a single body, for example.

The opposing wall 101 is formed in a flat plate shape, for example. The opposing wall 101 is formed so as to cover the upper surface of the protector main body 71, for example. The opposing wall 101 is provided so as to face the upper surface of the bottom wall portion 72 and the upper surfaces of the side wall portions 73 and 74, for example.

The locking portions 102 are formed so as to protrude downward from the lower surface of the opposing wall 101, for example. The locking portions 102 correspond to the locking portions 75 provided on the protector main body 71, for example. Due to the locking portions 102 being locked to the locking portions 75, for example, the cover 100 is fixed to the protector main body 71 in a state in which the opening in the path 80 is closed. Accordingly, the cover 100 makes it possible to maintain the closed state in which the opening in the path 80 is closed.

Specific Configuration of Path 80

As shown in FIG. 4, the path 80 includes a collective accommodation portion 81 (accommodation) provided at one end portion of the protector main body 71 in the length direction, a wire accommodation portion 82 (accommodation) in which the conductive path 20 is accommodated, an accommodation portion 83 in which the electromagnetic wave absorbing member 40 is accommodated, and a wire accommodation portion 84 in which the conductive path 30 is accommodated, for example.

Configuration of Collective Accommodation Portion 81

The collective accommodation portion 81 is formed so as to collectively accommodate the conductive path 20 and the conductive path 30, for example. Here, "collective accommodation" in this specification refers to the conductive path 20 and the conductive path 30 being accommodated without providing a wall between the conductive path 20 and the conductive path 30, for example. The collective accommodation portion 81 is formed so as to collectively accommodate the plurality of wires 21 and the plurality of wires 31, for example. The collective accommodation portion 81 is constituted by the space surrounded by the bottom wall portion 72 and the side wall portions 73 and 74, for example. The collective accommodation portion 81 has a groove shape, for example, and is formed so as to extend in the length direction of the wires 21 and 31, for example. The collective accommodation portion 81 is formed so as to be open upward in the drawing, for example. The collective accommodation portion 81 functions as a collective accommodation portion that collectively encloses the outer circumference of the wires 21 and 31 together with the cover 100 (see FIG. 3) covering the opening in the collective accommodation portion 81, for example. The wires 21 and the wires 31 are accommodated in the collective accommodation portion 81 in a state in which they are arranged side-by-side in the width direction of the protector 70, for example.

Configuration of Wire Accommodation Portion 82

The wire accommodation portion 82 is provided adjacent to the collective accommodation portion 81 in the length direction of the wires 21, for example. The wire accommodation portion 82 is provided adjacent to the accommodation portion 83 in the length direction of the wires 21, for example. The wire accommodation portion 82 is provided between the collective accommodation portion 81 and the accommodation portion 83, for example. The wire accommodation portion 82 is provided so as to individually accommodate the conductive path 20 out of the conductive paths 20 and 30, for example. The wire accommodation portion 82 is provided so as to collectively accommodate the plurality of wires 21, for example. The wires 21 are accommodated in the protector main body 71 so as to pass through the accommodation portion 82, for example.

As shown in FIG. 3, the wire accommodation portion 82 includes a side wall portion 73 and a partition 85 that extends in the length direction of the wires 21 and is spaced apart from the side wall portion 73 at a predetermined interval in the width direction of the protector 70, for example. The partition 85 is formed so as to extend upward from the upper surface of the bottom wall portion 72, for example. The wire accommodation portion 82 is constituted by the space surrounded by the side wall portion 73, the partition 85, and the bottom wall portion 72, for example. The wire accommodation portion 82 has a groove shape, for example, and is formed so as to extend in the length direction of the wires 21, for example.

Configuration of Partition 85

The partition 85 is provided so as to partition the wire accommodation portion 82 and the wire accommodation portion 84 from each other, for example. The partition 85 is provided between the side wall portion 73 and the side wall portion 74, for example. The partition 85 is provided so as to face the side wall portion 73 and face the side wall portion 74, for example. The upper surface of the partition 85 is formed in the same plane as the upper surface of the side wall portion 73, for example. An end portion of the partition 85 in the length direction on the collective accommodation portion 81 side is provided with a protruding wall 86 that protrudes toward the side wall portion 73, for example. The upper surface of the protruding wall 86 is formed in the same plane as the upper surface of the partition 85, for example.

The wire accommodation portion 82 functions as a wire accommodation portion that encloses the entire outer circumference of the wires 21 in the circumferential direction together with the cover 100 covering the opening in the wire accommodation portion 82, for example. The wire accommodation portion 82 is formed such that the dimension in the width direction thereof increases from the collective accommodation portion 81 toward the accommodation portion 83, for example.

Configuration of Accommodation Portion 83

The accommodation portion 83 is provided at an end portion of the protector 70 in the length direction, for example. The accommodation portion 83 is provided adjacent to the wire accommodation portion 82 in the length direction of the wires 21, for example. The accommodation portion 83 is formed so as to be in communication with the wire accommodation portion 82, for example. The accommodation portion 83 is provided so as to individually accommodate the conductive path 20 out of the conductive paths 20 and 30, for example. The conductive path 20 is accommodated in the protector main body 71 so as to pass through the accommodation portion 83, for example. The wires 21 are accommodated in the protector main body 71 so as to pass through the accommodation portion 83, for example. The accommodation portion 83 is provided so as to accommodate the electromagnetic wave absorbing member 40 provided on the outer circumference of the conductive path 20, for example. The accommodation portion 83 has a size large enough to be able to accommodate the entire electromagnetic wave absorbing member 40. The accommodation portion 83 is provided so as to accommodate a portion of the covering member 26 that is led out from both ends of the electromagnetic wave absorbing member 40 in the length direction, for example.

As shown in FIG. 4, the accommodation portion 83 extends in a direction intersecting with the length direction of the wires 21, and has wall portions 87 and 88 that are provided at a predetermined interval in the length direction of the wires 21, for example. The accommodation portion 83 has a side wall portion 89 that extends in the length direction of the wires 21, a side wall portion 90 that is connected to the side wall portion 89 and extends in the length direction of the wires 21, a partition 85, and a side wall portion 91 that is connected to the partition 85 and extends in the length direction of the wires 21, for example. The wall portions 87 and 88, the side wall portions 89 and 90, and the side wall portion 91 are formed so as to extend upward from the upper surface of the bottom wall portion 72, for example. The side wall portions 89 and 90 are provided between the wall portion 87 and the wall portion 88, for example. The side wall portions 89 and 90 are formed so as to connect the wall portion 87 and the wall portion 88 to each other, for example. The partition 85 and the side wall portion 91 are provided between the wall portion 87 and the wall portion 88, for example. The partition 85 and the side wall portion 91 are formed so as to connect the wall portion 87 and the wall portion 88 to each other, for example. The accommodation portion 83 is constituted by the space surrounded by the wall portions 87 and 88, the side wall portions 89 and 90, the partition 85, the side wall portion 91, and the bottom wall portion 72, for example. The accommodation portion 83 has a groove shape, for example, and is formed so as to extend in the length direction of the wires 21, for example. The overall planar shape of the accommodation portion 83 when viewed from above is a rectangular shape, for example.

Configuration of Wall Portions 87 and 88

The wall portions 87 and 88 are formed so as to extend in the width direction of the protector 70, for example. The wall portions 87 and 88 are respectively provided at both ends of the accommodation portion 83 in the length direction, for example. The wall portion 87 is formed so as to partition the wire accommodation portion 82 and the accommodation portion 83 from each other, for example. The wall portion 88 is provided at an end portion of the protector 70 in the length direction, for example. The wall portions 87 and 88 are provided so as to face the electromagnetic wave absorbing member 40 accommodated in the accommodation portion 83, for example. The wall portion 87 is provided so as to face one of the side walls 62 of the case 60, and the wall portion 88 is provided so as to face the other side wall 62 of the case 60, for example.

Configuration of Wall Portion 87

The wall portion 87 is provided with a through-hole 87X that passes through the wall portion 87 in the length direction, for example. The through-hole 87X has a size that allows the passage of the covering member 26 and does not allow the passage of the case 60 of the electromagnetic wave absorbing member 40, for example.

Figure 5:
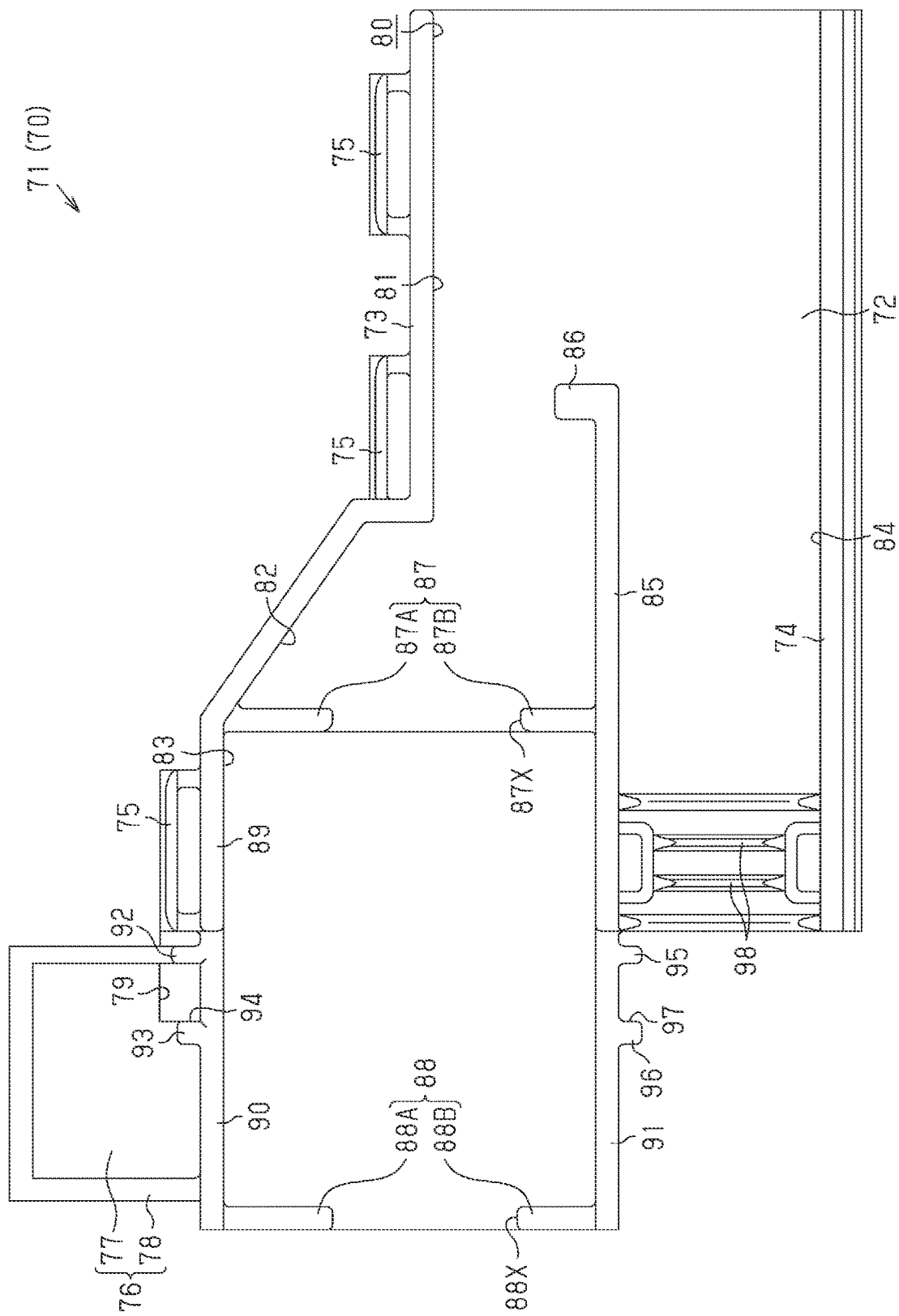
FIG. 5 is a schematic plan view showing a protector according to an embodiment.

As shown in FIG. 5, the wall portion 87 is constituted by two wall portions 87A and 87B that are provided at a predetermined interval in the width direction of the protector 70, for example. The two wall portions 87A and 87B are provided so as to face each other with the through-hole 87X interposed therebetween, for example.

The wall portion 87A is connected to the side wall portion 89, for example. The wall portion 87A is formed so as to extend from the inner circumferential surface of the side wall portion 89 toward the partition 85 in the width direction of the protector 70, for example. The wall portion 87A is formed lower than the side wall portion 89, for example. The upper surface of the wall portion 87A is formed at a position lower than the upper surface of the side wall portion 89, that is, at a position close to the bottom wall portion 72, for example.

The wall portion 87B is connected to the partition 85, for example. The wall portion 87B is formed so as to extend from a side surface of the partition 85, which faces the side wall portion 89, toward the side wall portion 89 in the width direction of the protector 70, for example. The wall portion 87B is formed so as to extend from a side surface of an intermediate portion in the length direction of the partition 85 toward the side wall portion 89, for example. The wall portion 87B is provided so as to face the wall portion 88B, for example. The wall portion 87B is formed lower than the partition 85, for example. The upper surface of the wall portion 87B is formed at a position lower than the upper surface of the partition 85, for example. The upper surface of the partition 87B is formed in the same plane as the upper surface of the wall portion 87A, for example.

Configuration of Wall Portion 88

The wall portion 88 is provided with a through-hole 88X that passes through the wall portion 88 in the length direction, for example. The through-hole 88X has a size that allows the passage of the covering member 26 (see FIG. 3) and does not allow the passage of the case 60 (see FIG. 3) of the electromagnetic wave absorbing member 40, for example. The wall portion 88 is constituted by two wall portions 88A and 88B that are provided at a predetermined interval in the width direction of the protector 70, for example. The two wall portions 88A and 88B are provided so as to face each other with the through-hole 88X interposed therebetween, for example.

The wall portion 88A is connected to the side wall portion 90, for example. The wall portion 88A is formed so as to extend from the inner circumferential surface of the side wall portion 90 toward the side wall portion 91 in the width direction of the protector 70, for example. The wall portion 88A is provided so as to face the wall portion 87A, for example. The wall portion 88A is formed lower than the side wall portion 90, for example. The upper surface of the wall portion 88A is formed at a position lower than the upper surface of the side wall portion 90, for example.

The wall portion 88B is connected to the side wall portion 91, for example. The wall portion 88B is formed so as to extend from the inner circumferential surface of the side wall portion 91 toward the side wall portion 90 in the width direction of the protector 70, for example. The wall portion 88B is provided so as to face the wall portion 87B, for example. The wall portion 88B is formed lower than the side wall portion 91, for example. The upper surface of the wall portion 88B is formed at a position lower than the upper surface of the side wall portion 91, for example. The upper surface of the partition 88B is formed in the same plane as the upper surface of the wall portion 88A, for example.

Configuration of Side Wall Portions 89 and 90

As shown in FIG. 4, the side wall portion 89 constitutes a portion of the side wall portion 73 of the protector main body 71, for example. The side wall portion 89 is connected to the side wall portion 73 that constitutes the wire accommodation portion 82, for example. The side wall portion 89 is provided between the wall portion 87A and the wall portion 88A, for example. One end portion of the side wall portion 89 in the length direction is connected to the wall portion 87A, for example. The side wall portion 89 is provided so as to face the partition 85, for example. The upper surface of the side wall portion 89 is formed in the same plane as the upper surface of the side wall portion 73 that constitutes the wire accommodation portion 82, for example.

The side wall portion 90 constitutes a portion of the side wall portion 73 of the protector main body 71, for example. One end portion of the side wall portion 90 in the length direction is connected to the side wall portion 89, and the other end portion thereof in the length direction is connected to the wall portion 88A, for example. The side wall portion 90 is provided so as to face the side wall portion 91, for example. The side wall portion 90 is formed lower than the side wall portion 89, for example. The upper surface of the side wall portion 90 is formed at a position lower than the upper surface of the side wall portion 89, for example.

The side wall portions 89 and 90 are provided so as to face the electromagnetic wave absorbing member 40 accommodated in the accommodation portion 83, for example. The side wall portions 89 and 90 are provided so as to face the circumferential wall 63 of the case 60, for example.

As shown in FIG. 2, the side wall portion 90 has a pair of mounting protrusions 92 and 93 that protrude outward from the outer circumferential surface of the side wall portion 90, for example. The mounting protrusions 92 and 93 are provided at a predetermined interval in the length direction of the wires 21, for example. The mounting protrusions 92 and 93 are provided in the vicinity of the side wall portion 89, for example. The mounting protrusions 92 and 93 are formed so as to extend in the height direction of the side wall portion 90, for example. The mounting protrusion 92 and the mounting protrusion 93 are formed so as to extend parallel to each other, for example. A mounting groove 94 for positioning the fixing member 110 in the length direction of the wires 21 is constituted by a region between the mounting protrusion 92 and the mounting protrusion 93. The mounting groove 94 is formed so as to be in communication with the through-hole 79 formed in the bottom wall portion 77 of the protruding portion 76, for example. The mounting protrusions 92 and 93 function to restrict the movement of the fixing member 110 mounted in the mounting groove 94 in the length direction of the wires 21, for example. The distance between the mounting protrusion 92 and the mounting protrusion 93, that is, the groove width of the mounting groove 94, is set according to the shape of the fixing member 110, for example.

Configurations of Partition 85 and Side Wall Portion 91

As shown in FIG. 3, the partition 85 is formed so as to partition the accommodation portion 83 and the wire accommodation portion 84 from each other, for example. The partition 85 in this embodiment is formed so as to partition the accommodation portion 83 and the wire accommodation portion 82 from the wire accommodation portion 84. The partition 85, which constitutes the accommodation portion 83, is provided between the side wall portion 89 and the side wall portion 74, for example. The partition 85, which constitutes the accommodation portion 83, is provided so as to face the side wall portion 89 and face the side wall portion 74, for example.

One end portion of the side wall portion 91 in the length direction is connected to the partition 85, and the other end portion thereof in the length direction is connected to the wall portion 88B, for example. The side wall portion 91 is provided so as to face the side wall portion 90, for example. The side wall portion 91 is formed lower than the partition 85, for example. The upper surface of the side wall portion 91 is formed at a position lower than the upper surface of the partition 85, for example.

The partition 85 and the side wall portion 91 are provided so as to face the electromagnetic wave absorbing member 40 accommodated in the accommodation portion 83, for example. The partition 85 and the side wall portion 91 are provided so as to face the circumferential wall 63 of the case 60, for example.

The side wall portion 91 has a pair of mounting protrusions 95 and 96 that protrude outward from the outer circumferential surface of the side wall portion 91, for example. The two mounting protrusions 95 and 96 are provided at a predetermined interval in the length direction of the wires 21, for example. The two mounting protrusions 95 and 96 are provided in the vicinity of the partition 85, for example. The two mounting protrusions 95 and 96 are provided at the same positions as the mounting protrusions 92 and 93 (see FIG. 4) in the length direction of the wires 21, for example. The mounting protrusions 95 and 96 are formed so as to extend in the height direction of the side wall portion 91, for example. The mounting protrusion 95 and the mounting protrusion 96 are formed so as to extend parallel to each other, for example. A mounting groove 97 for positioning the fixing member 110 in the length direction of the wires 21 is constituted by a region between the mounting protrusion 95 and the mounting protrusion 96. The mounting protrusions 95 and 96 function to suppress the movement of the fixing member 110 mounted in the mounting groove 97 in the length direction of the wires 21, for example. The distance between the mounting protrusion 95 and the mounting protrusion 96, that is, the groove width of the mounting groove 97, is set according to the shape of the fixing member 110, for example. The groove width of the mounting groove 97 is set to the same groove width of the mounting groove 94 (see FIG. 4), for example.

Relationship Between Accommodation Portion 83 and Conductive Path 20

As shown in FIG. 4, the conductive path 20 is routed in the protector 70 such that the electromagnetic wave absorbing member 40 is accommodated in the accommodation portion 83, for example. The entire electromagnetic wave absorbing member 40 is accommodated in the accommodation portion 83, for example. When the electromagnetic wave absorbing member 40 is accommodated in the accommodation portion 83, for example, one of the side walls 62 of the case 60 faces the wall portions 87A and 87B, and the other side wall 62 of the case 60 faces the wall portions 88A and 88B. Therefore, the wall portions 87A, 87B, 88A, and 88B make it possible to suppress the movement of the electromagnetic wave absorbing member 40 in the length direction of the wires 21. Also, when the electromagnetic wave absorbing member 40 is accommodated in the accommodation portion 83, for example, the circumferential wall 63 of the case 60 faces the side wall portions 89 and 90, and the circumferential wall 63 faces the partition 85 and the side wall portion 91. Therefore, the side wall portions 89, 90, and 91, and the partition 85 make it possible to suppress the movement of the electromagnetic wave absorbing member 40 in the width direction of the protector 70.

The dimension in the length direction of the covering member 26 is set longer than the distance between the wall portion 87 and the wall portion 88, for example. The covering member 26 is formed so as to pass through the wall portion 87 and pass through the wall portion 88, for example. The covering member 26 is formed so as to pass through the through-hole 87X in the wall portion 87 and pass through the through-hole 88X in the wall portion 88, for example. The covering member 26 that is led out from the case 60 toward the wire accommodation portion 82 is formed so as to pass through the through-hole 87X in the wall portion 87, and extend to the internal space of the wire accommodation portion 82, for example. Therefore, the wires 21 pass through the through-hole 87X in the wall portion 87 in a state in which the outer circumference of the wires 21 is covered by the covering member 26. Accordingly, it is possible to inhibit the wall portions 87A and 87B, which constitute the wall portion 87, from coming into contact with the outer circumferential surface of the wires 21. One end portion of the covering member 26 in the length direction is provided in the internal space of the wire accommodation portion 82, for example. The covering member 26, which is led out from the case 60 toward the wall portion 88, is formed so as to pass through the through-hole 88X in the wall portion 88 and be led out from the protector 70 to the outside, for example. Therefore, the wires 21 pass through the through-hole 88X in the wall portion 88 in a state in which the outer circumference of the wires 21 is covered by the covering member 26. Accordingly, it is possible to inhibit the wall portions 88A and 88B, which constitute the wall portion 88, from coming into contact with the outer circumferential surface of the wires 21.

The covering member 26 in this embodiment is formed so as to be inserted from the outside of the protector 70 into the protector 70, and to extend to the wire accommodation portion 82 through the accommodation portion 83 of the protector 70. One end portion of the covering member 26 in the length direction thereof is fixed by the fixing member 29 to the outer circumference of the wires 21 in the wire accommodation portion 82, for example. That is, the fixing member 29 is provided in the wire accommodation portion 82.

As shown in FIG. 2, a portion of the accommodation portion 83 is covered by the cover 100, for example. The space of the accommodation portion 83, which is surrounded by the wall portion 87 (see FIG. 4), the side wall portion 89, the partition 85, and the bottom wall portion 72, is covered by the cover 100, for example. On the other hand, the space of the accommodation portion 83, which is surrounded by the wall portion 88, the side wall portion 90, the side wall portion 91, and the bottom wall portion 72, is not covered by the cover 100, and is exposed from the cover 100, for example. Therefore, a portion of the electromagnetic wave absorbing member 40 accommodated in the accommodation portion 83 is covered by the cover 100, and the remaining portions are exposed from the cover 100, for example. The portion of the accommodation portion 83 exposed from the cover 100 protrudes outward in the length direction relative to the wire accommodation portion 84, for example.

Configuration of Fixing Member 110

The fixing member 110 is provided so as to fasten and fix the electromagnetic wave absorbing member 40 exposed from the cover 100 to the protector main body 71, for example. The fixing member 110 is provided so as to enclose the entire outer circumference, which is exposed from the cover 100, of the electromagnetic wave absorbing member 40 in the circumferential direction, for example. The fixing member 110 is provided so as to enclose the entire outer circumference, which is exposed from the cover 100, of the protector main body 71 in the circumferential direction, for example. The fixing member 110 is provided so as to fasten the outer circumference of the electromagnetic wave absorbing member 40 to the inner circumferential surface of the accommodation portion 83 in the protector main body 71, for example. The electromagnetic wave absorbing member 40 is fixed by the fixing member 110 to the protector main body 71 so as to be in intimate contact with the inner circumferential surface of the accommodation portion 83, in particular, the upper surface of the bottom wall portion 72 that constitutes the accommodation portion 83, for example.

The fixing member 110 is a cable tie made of a synthetic resin, for example. The fixing member 110 has an elongated belt-shaped portion 111 (elongated belt shape), and a locking portion 112 (lock) that is formed as a single body with the belt-shaped portion 111 at the base end portion of the belt-shaped portion 111 in the length direction, for example. Polypropylene, polyether ether ketone, a fluororesin, or the like can be used as the material of the fixing member 110, for example.

The transverse cross-sectional shape of the locking portion 112 is larger than that of the belt-shaped portion 111, for example. The locking portion 112 is formed so as to protrude outward from the outer circumferential surface of the belt-shaped portion 111, for example. The locking portion 112 is formed so as to protrude outward from the outer circumferential surface of the belt-shaped portion 111 in the radial direction, for example. The locking portion 112 is formed in a rectangular cuboid shape, for example.

As shown in FIG. 6, the locking portion 112 has an insertion port 113 into which the belt-shaped portion 111 is insertable, for example. The inner surface of the insertion port 113 is provided with a locking claw 114, for example. On the outer circumferential surface of a leading end portion 111A of the belt-shaped portion 111 in the length direction, a plurality of locking grooves (not shown), which extend in the width direction of the belt-shaped portion 111, are formed at predetermined intervals in the length direction of the belt-shaped portion 111, for example. With the fixing member 110 in this embodiment, the belt-shaped portion 111 is locked to the locking portion 112 by locking the locking claw 114 of the locking portion 112 to one of the plurality of locking grooves formed in the belt-shaped portion 111. With the fixing member 110, it is possible to adjust the degree of fastening of the electromagnetic wave absorbing member 40 and the protector main body 71 by the belt-shaped portion 111 according to the degree of insertion of the belt-shaped portion 111 into the locking portion 112, for example.

The belt-shaped portion 111 of the fixing member 110 is wound around the outer circumference of the electromagnetic wave absorbing member 40 and is wound around the outer circumference of the protector main body 71 in a state in which the leading end portion 111A of the belt-shaped portion 111 is inserted into the insertion port 113 of the locking portion 112. The belt-shaped portion 111 is wound along the outer circumference of the circumferential walls 63A and 63B of the case 60, for example. The belt-shaped portion 111 is wound so as to be in contact with the outer circumferential surfaces of some of the circumferential walls 63A and 63B of the case 60, for example. The belt-shaped portion 111 is wound along the outer circumferential surfaces of the bottom wall portion 72 and the side wall portions 90 and 91 that constitute the accommodation portion 83, for example. The belt-shaped portion 111 is wound so as to be in contact with the lower surface of the bottom wall portion 72 that constitutes the accommodation portion 83 and be in contact with the outer circumferential surfaces of the side wall portions 90 and 91, for example. At this time, as shown in FIG. 4, the belt-shaped portion 111 is mounted to pass through the mounting groove 94 between the two mounting protrusions 92 and 93 and to be wound around the lower surface of the bottom wall portion 72 through the through-hole 79, for example. Also, the belt-shaped portion 111 is mounted to pass through the mounting groove 97 between the two mounting protrusions 95 and 96 and to pass through between the pairs of protruding portions 65 and 66, for example.

As shown in FIG. 6, the leading end portion 111A of the belt-shaped portion 111 protrudes outward from the locking portion 112, for example. The leading end portion 111A of the belt-shaped portion 111 protrudes outward from the locking portion 112 in the radial direction of the case 60, for example. Note that the locking portion 112 is disposed on the outer circumferential surface of the circumferential wall 63A located at the uppermost side of the circumferential wall 63 of the case 60 in the example shown in FIG. 6.

As shown in FIG. 4, in this specification, the length of the electromagnetic wave absorbing member 40 in the length direction of the wires 21 is regarded as a length L1, and the length of the accommodation portion 83 in the length direction of the wires 21 is regarded as a length L2. The groove width of the mounting groove 94 in the length direction of the wires 21 is regarded as a groove width W1, and the shortest distance between the pair of protruding portions 65 and 66 in the length direction of the wires 21 is regarded as the shortest distance D1. Here, the length L1 refers to the distance between the two side walls 62 of the case 60, for example. The length L1 refers to the shortest distance between a portion of the outer circumferential surface of one of the side walls 62 that protrudes most outwardly and a portion of the outer circumferential surface of the other side wall 62 that protrudes most outwardly, for example. The length L2 refers to the shortest distance between the inner circumferential surface of the wall portion 87 that faces the side wall 62 and the inner circumferential surface of the wall portion 88 that faces the side wall 62, for example. The groove width W1 refers to the shortest distance between the inner circumferential surface of the mounting protrusion 92 and the inner circumferential surface of the mounting protrusion 93 between the two mounting protrusions 92 and 93, for example. The shortest distance D1 refers to the shortest distance between the opposing surface 65A of the protruding portion 65 and the opposing surface 66A of the protruding portion 66 between the pair of protruding portions 65 and 66, for example.

Also, in this specification, the shortest distance between the inner circumferential surface of the mounting protrusion 93, which is provided on the side farther from the wall portion 87 out of the two mounting protrusions 92 and 93, and the inner circumferential surface of the wall portion 87 that faces the side wall 62 is regarded as the shortest distance D2. The shortest distance between the opposing surface 66A of the protruding portion 66, which is provided on the side farther from the wall portion 87 out of the pair of protruding portions 65 and 66, and a portion of the outer circumferential surface, which protrudes most outwardly, of the side wall 62 that faces the wall portion 87 is regarded as the shortest distance D3.

The length L2 of the accommodation portion 83 is set longer than the length L1 of the electromagnetic wave absorbing member 40 in the protector main body 71.

With the protector main body 71, the length L1, the length L2, and the shortest distance D1 satisfy Expression 1 below, for example.

$$D1 > L2 - L1 \quad \text{Expression 1:}$$

With the protector main body 71, the length L1, the length L2, the groove width W1, and the shortest distance D1 satisfy Expression 2 below, for example.

$$D1 > (L2 - L1) + W1 \quad \text{Expression 2:}$$

The length L2 of the accommodation portion 83 is set such that, with the protector main body 71, Expression 1 above and Expression 2 above are satisfied, for example.

Here, with the protector main body 71 in this embodiment, the shortest distance D2 between the inner circumferential surface of the mounting protrusion 93 and the inner circumferential surface of the wall portion 87, and the shortest distance D3 between the opposing surface 66A of the protruding portion 66 and the outer circumferential surface of the side wall 62 are set to substantially the same length. Therefore, with the protector main body 71, when the outer circumferential surface of one of the side walls 62 of the case 60 is brought into contact with the inner circumferential surface of the wall portion 87, the inner circumferential surface of the mounting protrusion 93 and the opposing surface 66A of the protruding portion 66 are provided at the same position in the length direction of the wires 21.

Configuration of Wire Accommodation Portion 84

As shown in FIG. 3, the wire accommodation portion 84 is provided at an end portion of the protector main body 71 in the length direction, for example. The wire accommodation portion 84 is provided adjacent to the collective accommodation portion 81 in the length direction of the wires 31, for example. The wire accommodation portion 84 is provided so as to individually accommodate the conductive path 30, out of the conductive paths 20 and 30, for example. The wire accommodation portion 84 is provided so as to collectively accommodate the plurality of wires 31, for example. The wires 31 are accommodated in the protector main body 71 so as to pass through the accommodation portion 84, for example. The wire accommodation portion 84 is provided so as to accommodate a portion of the covering member 36 in the length direction, for example.

The wire accommodation portion 84 is provided side-by-side and in parallel with the accommodation portion 83 and the wire accommodation portion 82, for example. The wire accommodation portion 84 is provided side-by-side with the accommodation portion 83 and the wire accommodation portion 82 with the partition 85 interposed therebetween, for example. The wire accommodation portion 84 is constituted by the space surrounded by the partition 85, the side wall portion 74, and the bottom wall portion 72, for example. The wire accommodation portion 84 has a groove shape, for example, and is formed so as to extend in the length direction of the wires 31, for example. The wire accommodation portion 84 is formed so as to be open in a direction (the upper side in FIG. 3) that intersects with the length direction of the wires 31, for example.

The upper surface of the bottom wall portion 72 that constitutes the wire accommodation portion 84 is provided with a plurality of ribs 98, for example. The plurality of ribs 98 are provided at predetermined intervals in the length direction of the wires 31, for example. Each rib 98 is formed so as to protrude upward from the upper surface of the bottom wall portion 72, for example. Each rib 98 is formed in an arc shape corresponding to the outer circumferential surface of the ring-shaped recesses 38, for example. The ribs 98 are formed so as to respectively fit in the ring-shaped recesses 38 in the covering member 36, for example. When an end portion of the covering member 36 in the length direction is accommodated in the wire accommodation portion 84, for example, the plurality of ribs 98 are respectively fit in the ring-shaped recesses 38. Accordingly, it is possible to suppress the movement of the covering member 36 in the length direction of the wire 31.

As shown in FIG. 2, with the protector 70, the cover 100 is attached to the protector main body 71 so as to cover the wire accommodation portion 84, for example, and thereby the wire accommodation portion 120, which encloses the outer circumference of the conductive path 30, is constituted. The wire accommodation portion 120 is constituted by the wire accommodation portion 84 and the cover 100 covering the opening in the wire accommodation portion 84, for example.

Next, the effects of this embodiment will be described.

(1) The wire harness 10 includes the wires 21, the electromagnetic wave absorbing member 40 provided on outer circumferences of portions of the wires 21 in the length direction of the wires 21, the protector 70 that has the accommodation portion 83 that accommodates the wires 21 and accommodates the electromagnetic wave absorbing member 40, and the fixing member 110 that fixes the electromagnetic wave absorbing member 40 to the protector 70.

According to this configuration, the electromagnetic wave absorbing member 40 is accommodated in the protector 70, and the electromagnetic wave absorbing member 40 is fixed to the protector 70 by the fixing member 110. Thus, it is possible to more stably hold the electromagnetic wave absorbing member 40 with the protector 70 and the fixing member 110 compared to a case where the electromagnetic wave absorbing member 40 is held by only the wires 21.

Accordingly, it is possible to suppress vibration of the electromagnetic wave absorbing member 40 due to vibration caused by traveling of a vehicle, and to suppress impairment of the wires 21 due to the vibration of the electromagnetic wave absorbing member 40.

(2) The mounting grooves 94 and 97 for positioning the fixing member 110 in the length direction of the wires 21 are formed in the outer circumferential surface of the protector 70. According to this configuration, the fixing member 110 can be positioned by mounting the fixing member 110 in the mounting grooves 94 and 97. Therefore, it is possible to improve workability when mounting the fixing member 110 on the electromagnetic wave absorbing member 40 and the protector 70.

(3) Also, the movement of the fixing member 110 in the length direction of the wires 21 can be suppressed by mounting the fixing member 110 in the mounting grooves 94 and 97. Accordingly, it is possible to suppress displacement of the fixing member 110 in the length direction of the wires 21. Therefore, the electromagnetic wave absorbing member 40 can be stably fixed to the protector 70 by the fixing member 110.

(4) The pairs of protruding portions 65 and 66 are formed on the outer circumferential surface of the ring-shaped case 60 that accommodates the magnetic core 50 at intervals in the length direction of the wires 21. According to this configuration, by mounting the fixing member 110 between the pairs of protruding portions 65 and 66, the movement of the fixing member 110 on the outer circumferential surface of the case 60 in the length direction of the wires 21 can be restricted by the pairs of protruding portions 65 and 66. Accordingly, it is possible to suppress displacement of the fixing member 110 in the length direction of the wires 21. Therefore, the electromagnetic wave absorbing member 40 can be stably fixed to the protector 70 by the fixing member 110.

(5) The length L1 of the electromagnetic wave absorbing member 40, the length L2 of the accommodation portion 83, the groove width W1 of the mounting groove 94, and the shortest distance D1 between the pair of protruding portions 65 and 66 satisfy the relational expression D1>(L2−L1)+W1.

According to this configuration, even if the electromagnetic wave absorbing member 40 has moved in the length direction of the wires 21 in the accommodation portion 83, the mounting groove 94 can be suitably disposed between the pair of protruding portions 65 and 66 in the length direction of the wires 21. Accordingly, the fixing member 110 can be mounted between the pair of protruding portions 65 and 66 by mounting the fixing member 110 in the mounting groove 94. As a result, it is possible to suppress displacement of the fixing member 110 on the outer circumferential surface of the protector 70 and to suppress displacement of the fixing member 110 on the outer circumferential surface of the electromagnetic wave absorbing member 40.

(6) Furthermore, in addition to the configuration (5) above, the shortest distance D2 between the inner circumferential surface of the mounting protrusion 93 and the inner circumferential surface of the wall portion 87, and the shortest distance D3 between the opposing surface 66A of the protruding portion 66 and the outer circumferential surface of the side wall 62 are set to substantially the same length. According to this configuration, even if the electromagnetic wave absorbing member 40 has moved in the length direction of the wires 21 in the accommodation portion 83, the mounting groove 94 can be reliably disposed between the pairs of protruding portions 65 and 66 in the length direction of the wires 21. Accordingly, the fixing member 110 can be always mounted between the pairs of protruding portions 65 and 66 by mounting the fixing member 110 in the mounting groove 94.

(7) The electromagnetic wave absorbing member 40 is provided on the outer circumference of the covering member 26 covering the outer circumference of the wires 21. Therefore, the covering member 26 is interposed between the wires 21 and the electromagnetic wave absorbing member 40. Therefore, it is possible to inhibit the electromagnetic wave absorbing member 40 from coming into direct contact with the outer circumferential surface of the wires 21. Accordingly, it is possible to suppress impairment of the wires 21 due to the contact between the wires 21 and the electromagnetic wave absorbing member 40.

(8) The covering member 26 has the ring-shaped protrusions 27 and the ring-shaped recesses 28 on the outer circumferential surface thereof. The case 60 has the locking portions 64 that are locked to the ring-shaped protrusions 27 in the length direction of the covering member 26. According to this configuration, as a result of the ring-shaped protrusions 27 of the covering member 26 and the locking portions 64 of the case 60 being locked to each other, it is possible to suppress the movement of the electromagnetic wave absorbing member 40 in the length direction of the covering member 26. Accordingly, it is possible to suppress displacement of the electromagnetic wave absorbing member 40 in the length direction of the covering member 26.

(9) The accommodation portion 83 has the wall portions 87 and 88 that are provided at a predetermined interval in the length direction of the wires 21 so as to face the electromagnetic wave absorbing member 40. According to this configuration, the movement of the electromagnetic wave absorbing member 40 in the length direction of the wires 21 in the accommodation portion 83 of the protector 70 can be restricted by the wall portions 87 and 88. Accordingly, it is possible to restrict the movement of the electromagnetic wave absorbing member 40 in the protector 70. In particular, it is possible to restrict the movement of the electromagnetic wave absorbing member 40 in the protector 70 before the electromagnetic wave absorbing member 40 is fixed to the protector 70 by the fixing member 110. As a result, it is possible to suppress the occurrence of abnormal noise and impairment of the electromagnetic wave absorbing member 40 due to contact between the electromagnetic wave absorbing member 40 and the protector 70.

(10) The covering member 26 is formed so as to pass through the wall portion 87 and pass through the wall portion 88. According to this configuration, the wires 21 are passed through the wall portion 87 in a state in which the wires 21 are covered by the covering member 26, and the wires 21 are passed through the wall portion 88 in a state in which the wires 21 are covered by the covering member 26. Therefore, the covering member 26 can be interposed between the outer circumferential surface of the wires 21 and the wall portion 87, and the covering member 26 can be interposed between the outer circumferential surface of the wires 21 and the wall portion 88. Accordingly, it is possible to inhibit the wall portions 87 and 88 from coming into direct contact with the outer circumferential surface of the wires 21. As a result, it is possible to suppress impairment of the wires 21 due to the contact with the wall portions 87 and 88.

(11) The protector 70 is provided with the wire accommodation portion 84 that is partitioned from the accommodation portion 83 by the partition 85, and is provided side-by-side with the accommodation portion 83. Also, the wires 21 and the electromagnetic wave absorbing member 40 are accommodated in the accommodation portion 83, and the wires 31 are accommodated in the wire accommodation portion 84. Therefore, the electromagnetic wave absorbing member 40 and the wires 31 are separately accommodated in the accommodation portion 83 and the wire accommodation portion 84 that are partitioned from each other by the partition 85. Accordingly, the partition 85 can be interposed between the wires 31 and the electromagnetic wave absorbing member 40, and thus it is possible to inhibit the electromagnetic wave absorbing member 40 from coming into direct contact with the outer circumferential surface of the wires 31. As a result, it is possible to suppress impairment of the wires 31 due to the contact between the wires 31 and the electromagnetic wave absorbing member 40.

Other Embodiments

The above-described embodiment can be modified as follows. The above-described embodiment and the following modified examples may be combined to the extent that they do not contradict each other technically.

Although a cable tie made of a synthetic resin is used as the fixing member 110 in the above-described embodiment, there is no limitation thereto. The fixing member 110 may be constituted by a cable tie made of metal, for example.

Although a cable tie is used as the fixing member 110 in the above-described embodiment, there is no limitation thereto. The fixing member 110 may be constituted by a tape member, for example.

The covering member 26 is provided such that one end portion of the covering member 26 in the length direction thereof is accommodated in the protector 70 in the above-described embodiment. There is no limitation thereto, and the covering member 26 may be provided so as to pass through the protector 70 in the length direction, for example.

Although the covering member 26 is provided so as to pass through the wall portion 87 in the above-described embodiment, there is no limitation thereto. The wires 21 that are led out from the covering member 26 may pass through the wall portion 87, for example.

Although the covering member 26 is provided so as to pass through the wall portion 88 in the above-described embodiment, there is no limitation thereto. The wires 21 that are led out from the covering member 26 may pass through the wall portion 88, for example.

Although a corrugated tube made of a synthetic resin is used as the covering member 26 in the above-described embodiment, there is no limitation thereto. A corrugated tube made of metal may be used as the covering member 26, for example.

Although a corrugated tube whose outer circumferential surface has the ring-shaped protrusions 27 and the ring-shaped recesses 28 as the first locking portions is used as the covering member 26, an outer cover member other than a corrugated tube may be used as the covering member 26. There is no particular limitation on the structure of the covering member 26 as long as the covering member 26 has a structure in which the first locking portions, which are locked to the locking portions 64 serving as the second locking portions (second locks) in the length direction of the covering member 26, are formed on the outer circumferential surface thereof, for example.

The structure of the covering member 26 in the above-described embodiment may be changed to a structure in which the outer circumferential surface thereof does not have the first locking portion. The outer circumference of the wires 21 may be enclosed by an outer cover member having a smooth outer circumferential surface, instead of the covering member 26, for example.

The covering member 26 in the above-described embodiment may be provided so as to enclose only the outer circumference of the wires 21 that are led out from the protector 70. In this case, the electromagnetic wave absorbing member 40 is provided on the outer circumference of the wires 21. At this time, the electromagnetic wave absorbing member 40 is fixed to the outer circumference of the wires 21 by a tape member or the like, for example.

The covering member 26 in the above-described embodiment may be omitted.

The covering member 36 is provided such that one end portion of the covering member 36 in the length direction thereof is accommodated in the protector 70 in the above-described embodiment. There is no limitation thereto, and the covering member 36 may be provided so as to pass through the protector 70 in the length direction, for example. Also, the covering member 36 may be provided only on the outside of the protector 70. In this case, the covering member 36 is provided so as to enclose only the outer circumference of the wires 31 that are led out from the protector 70.

Although a corrugated tube made of a synthetic resin is used as the covering member 36 in the above-described embodiment, there is no limitation thereto. A corrugated tube made of metal may be used as the covering member 36, for example.

An outer cover member other than a corrugated tube may be used as the covering member 36 in the above-described embodiment.

The covering member 36 in the above-described embodiment may be omitted.

The ribs 98 in the wire accommodation portion 84 in the above-described embodiment may be omitted.

Although the accommodation portion 83 is provided at an end portion of the wall portion 70 in the length direction in the above-described embodiment, there is no limitation thereto. The accommodation portion 83 may be provided at an intermediate portion of the protector 70 in the length direction, for example.

Although a portion of the accommodation portion 83 is exposed from the cover 100 in the above-described embodiment, there is no limitation thereto. The entire accommodation portion 83 may be covered by the cover 100, for example. In this case, the entire electromagnetic wave absorbing member 40 is also covered by the cover 100.

Although the protector main body 71 and the cover 100 are formed as separate components in the above-described embodiment, there is no limitation thereto. A configuration may be adopted in which, instead of the cover 100, a cover is formed as a single body with the protector main body 71 via a hinge portion or the like, for example.

The cover 100 in the above-described embodiment may be omitted.

The protruding portion 76 may be omitted from the protector 70 in the above-described embodiment.

The collective accommodation portion 81 may be omitted from the protector 70 in the above-described embodiment.

The wire accommodation portions 84 and 120 may be omitted from the protector 70 in the above-described embodiment.

The protector 70 in the above-described embodiment may be configured to accommodate only the conductive path 20.

A cushioning member may be provided between the protector 70 and the case 60 of the electromagnetic wave absorbing member 40 in the above-described embodiment.

A clip for fixing a vehicle body may be provided on the protector 70 in the above-described embodiment.

There is no particular limitation on the outer circumferential shape and the inner circumferential shape of the case 60 in the above-described embodiment. The case 60 may be formed in a circular ring shape, for example.

The protruding portions 65 and 66 may be omitted from the case 60 in the above-described embodiment.

Although the electromagnetic wave absorbing member 40 is constituted by the magnetic core 50 and the case 60 in the above-described embodiment, there is no limitation thereto. A cushioning member may be provided between the outer circumferential surface 50A of the magnetic core 50 and the inner circumferential surface of the case 60, for example. The case 60 may be omitted, for example. In this case, the electromagnetic wave absorbing member 40 is constituted by only the magnetic core 50.

Although two wires 21 are accommodated in the outer cover member 25 in the above-described embodiment, there is no particular limitation thereto, and the number of wires 21 can be changed according to the specifications of the vehicle V. The number of wires 21 accommodated in the outer cover member 25 may be one, or three or more, for example.

Although two wires 31 are accommodated in the outer cover member 35 in the above-described embodiment, there is no particular limitation thereto, and the number of wires 31 can be changed according to the specifications of the vehicle V. The number of wires 31 accommodated in the outer cover member 35 may be one, or three or more, for example.

Although the conductive path 20 is constituted by the wires 21 and the outer cover member 25 in the above-described embodiment, there is no limitation thereto. An electromagnetic shielding member may be provided in the outer cover member 25, for example. The electromagnetic shielding member is provided so as to collectively enclose the plurality of wires 21, for example. The electromagnetic shielding member is provided between the inner circumferential surface of the outer cover member 25 and the outer circumferential surface of the plurality of wires 21, for example. It is possible to use a flexible braided wire or metal film as an electromagnetic shielding member, for example.

It is possible to use a braided wire in which multiple bare metal wires are braided, and a braided wire in which a bare metal wire and a bare resin wire are braided together, as a braided wire. A metallic material such as a copper-based material or an aluminum-based material can be used as the material of the bare metal wire, for example. It is possible to use reinforced fibers with good insulating properties and shear resistance, such as para-aramid fibers, as a bare resin wire, for example.

Although the conductive path 30 is constituted by the wires 31 and the outer cover member 35 in the above-described embodiment, there is no limitation thereto. An electromagnetic shielding member may be provided in the outer cover member 35, for example. The electromagnetic shielding member is provided so as to collectively enclose the plurality of wires 31, for example. The electromagnetic shielding member is provided between the inner circumferential surface of the outer cover member 35 and the outer circumferential surface of the wires 31, for example. It is possible to use a flexible braided wire or metal film as an electromagnetic shielding member, for example.

The wires 21 in the above-described embodiment may be changed to shielded wires.

The wires 21 in the above-described embodiment may be changed to low-voltage wires.

The wires 31 in the above-described embodiment may be changed to shielded wires.

The wires 31 in the above-described embodiment may be changed to high-voltage wires.

The conductive path 30 in the above-described embodiment may be omitted.

There is no particular limitation on the number and installation positions of electromagnetic wave absorbing members 40 in the above-described embodiment. Two or more electromagnetic wave absorbing members 40 may be provided on the wire harness 10, for example.

The arrangement relationship of the devices M1 to M4 in the vehicle V is not limited to the above-described embodiment, and may be changed as appropriate according to the configuration of the vehicle.

As shown in FIGS. 2, 3, and 6, the height of the side wall portions 90 and 91 that define a portion of the accommodation portion 83 of the protector 70 may be smaller than the total height of the electromagnetic wave absorbing member 40. One or both of the side wall portions 90 and 91 may have a height corresponding to a lower portion of the electromagnetic wave absorbing member 40 extending from the lowest position of the electromagnetic wave absorbing member 40 to a predetermined height position, for example. In the example shown in FIG. 6, the side wall portion 91 may have a height corresponding to the difference obtained by subtracting the diameter of the conductive path 30 from the total height of the electromagnetic wave absorbing member 40. Comparatively low side wall portions 90 and 91 are advantageous for allowing the fixing member 110 to be in direct contact with outward surfaces of the side wall portions 90 and 91 that cover the lower portion of the electromagnetic wave absorbing member 40 and an outward surface of an upper portion of the electromagnetic wave absorbing member 40 that is not covered by the side wall portions 90 and 91, and thereby tightly fastening the electromagnetic wave absorbing member 40 to the protector 70.

As shown in FIGS. 3 and 6, the uppermost end of the mounting groove 97 (the mounting protrusions 95 and 96) for positioning the belt-shaped portion 111 of the fixing member 110 may be located at the same position as or below the lowermost end of the wire accommodation portion 84 for accommodating the conductive path 30. This configuration is advantageous for arranging the electromagnetic wave absorbing member 40 and the conductive path 30 close to each other side-by-side. This is because, with a configuration in which the electromagnetic wave absorbing member 40 and the conductive path 30 are accommodated in the protector 70 side-by-side, for example, in a reference example in which the mounting groove 97 is located above the lowermost end of the wire accommodation portion 84, the conductive path 30 needs to be kept away from the electromagnetic wave absorbing member 40 in the width direction such that the mounting protrusions 95 and 96, which protrude from the side wall portion 91, do not interfere with the conductive path 30, and as a result, the size of the protector 70 needs to be increased in the width direction in some cases.

The electromagnetic wave absorbing member 40 in an embodiment may be referred to as an electromagnetic noise filter attached coaxially with the first conductive path 20. The electromagnetic wave absorbing member 40 in an embodiment is placed on the bottom wall portion 72 of the accommodation portion 83 of the protector 70, and the bottom wall portion 72 may be referred to as an electromagnetic noise filter seat or a base of the accommodation portion 83. The wall portions 87 and 88 of the accommodation portion 83 in an embodiment may be referred to as axial stoppers that limit the movement (axial movement) of the electromagnetic wave absorbing member 40 in the length direction with respect to the bottom wall portion 72, through direct contact with the electromagnetic wave absorbing member 40 in the length direction of the wires 21 or the protector 70. The side wall portions 89, 90, and 91 of the accommodation portion 83 in an embodiment may be referred to as lateral stoppers that limit the movement (lateral movement) of the electromagnetic wave absorbing member 40 in the width direction with respect to the bottom wall portion 72, through direct contact with the electromagnetic wave absorbing member 40 in the width direction of the wires 21 or the protector 70. The fixing member 110 in an embodiment may be referred to as lift stoppers that limit the movement (lifting) of the electromagnetic wave absorbing member 40 in the height direction with respect to the bottom wall portion 72, through direct contact with the electromagnetic wave absorbing member 40 in the height direction of the wires 21 or the protector 70.

The embodiments that were disclosed here are to be considered in all aspects to be illustrative and not restrictive. The scope of the present disclosure is defined by the claims and not by the above description, and all changes that come within the meaning and range of equivalency of the claims are intended to be embraced therein.

The invention claimed is:

1. A wire harness comprising:
a wire;
an electromagnetic wave absorber provided on an outer circumference of a portion of the wire in a length direction of the wire;
a protector that has an accommodation configured to accommodate the wire and accommodate the electromagnetic wave absorber; and
a first fixing member configured to fix the electromagnetic wave absorber to the protector,
wherein an outer circumferential surface of the electromagnetic wave absorber has a pair of protrusions provided at an interval in the length direction of the wire, and the first fixing member is mounted to pass through the interval between the pair of protrusions.

2. The wire harness according to claim 1,
wherein an outer circumferential surface of the protector has a mounting groove for positioning the first fixing member in the length direction of the wire.

3. The wire harness according to claim 2, wherein:
the electromagnetic wave absorber includes a ring-shaped magnetic core and a ring-shaped case configured to accommodate the magnetic core, and
an outer circumferential surface of the case has the pair of protrusions.

4. The wire harness according to claim 3, further comprising:
a cover that covers an outer circumference of a portion of the wire in the length direction; and
a second fixing member configured to fix one end of the cover in a length direction of the cover to the wire, wherein:
the electromagnetic wave absorber is provided on an outer circumference of the cover,
the cover has a first lock formed on an outer circumferential surface thereof, and
the case has a second lock that is locked to the first lock in the length direction of the cover.

5. The wire harness according to claim 4, wherein:
the cover is a corrugated tube having an accordion structure in which ring-shaped protrusions and ring-shaped recesses are arranged alternatingly in an axial direction in which a central axis of the cover extends,
the case has two side walls that are provided at two ends of the case in an axial direction of the case and a circumferential wall that is provided between the two side walls and extends in a circumferential direction and the axial direction of the case,
the side walls are each provided with a through-hole through which the cover passes,
the second lock is formed so as to protrude inward from an inner circumferential surface of the through-hole in a radial direction of the case, and
the second lock fits in a ring-shaped recess among the ring-shaped recesses.

6. The wire harness according to claim 4, wherein:
the accommodation has a first wall and a second wall that extend in a direction intersecting with the length direction of the wire and are provided at an interval in the length direction of the wire, and
the first wall and the second wall each face the electromagnetic wave absorber.

7. The wire harness according to claim 6,
wherein the cover is provided so as to pass through the first wall and pass through the second wall.

8. The wire harness according to claim 3,
wherein a length L1 of the electromagnetic wave absorber in the length direction of the wire, a length L2 of the accommodation in the length direction of the wire, a groove width W1 of the mounting groove in the length direction of the wire, and a shortest distance D1 between the pair of protrusions in the length direction of the wire satisfy a relational expression D1>(L2−L1)+W1.

9. The wire harness according to claim 1, wherein:
the wire is a first wire,
the wire harness further comprises a second wire that is different from the first wire,
the protector has a wire accommodation provided side-by-side with the accommodation and a partition configured to partition the accommodation and the wire accommodation from each other,
the first wire passes through the accommodation, and
the second wire passes through the wire accommodation.

10. The wire harness according to claim 1,
wherein the first fixing member is a cable tie that has an elongated belt shape and a lock that is formed as a single body with the belt shape at a base end of the belt shape in a length direction of the belt shape.

11. A wire harness comprising:
a wire;
an electromagnetic wave absorber provided on an outer circumference of a portion of the wire in a length direction of the wire;
a protector that has an accommodation configured to accommodate the wire and accommodate the electromagnetic wave absorber; and
a first fixing member configured to fix the electromagnetic wave absorber to the protector, wherein:
the wire is a first wire,
the wire harness further comprises a second wire that is different from the first wire,
the protector has a wire accommodation provided side-by-side with the accommodation and a partition configured to partition the accommodation and the wire accommodation from each other,
the first wire passes through the accommodation, and
the second wire passes through the wire accommodation.

* * * * *